(12) United States Patent
Kato et al.

(10) Patent No.: US 6,819,700 B2
(45) Date of Patent: Nov. 16, 2004

(54) METHOD OF MANUFACTURING AN EXTERNAL CAVITY SEMICONDUCTOR LASER, EXTERNAL CAVITY SEMICONDUCTOR LASER, AND WAVELENGTH MULTIPLEX TRANSMISSION SYSTEM

(75) Inventors: Takashi Kato, Yokohama (JP); Jun-ichi Hashimoto, Yokohama (JP); Naoyuki Yamabayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/215,259

(22) Filed: Aug. 9, 2002

(65) Prior Publication Data

US 2003/0086468 A1 May 8, 2003

Related U.S. Application Data

(60) Provisional application No. 60/318,333, filed on Sep. 12, 2001.

(30) Foreign Application Priority Data

Aug. 9, 2001 (JP) ..................................... P2001-242323

(51) Int. Cl.[7] .............................................. H01S 3/08
(52) U.S. Cl. ........................................... 372/92; 6/102
(58) Field of Search .............................. 372/6, 92, 102, 372/98

(56) References Cited

U.S. PATENT DOCUMENTS

| | | | | |
|---|---|---|---|---|
| 5,914,978 A | * | 6/1999 | Welch et al. | 372/50 |
| 6,244,754 B1 | * | 6/2001 | Takagi et al. | 385/88 |
| 6,366,396 B1 | | 4/2002 | Hayashi | 359/344 |
| 6,415,078 B1 | * | 7/2002 | Shigehara et al. | 385/37 |
| 6,587,491 B1 | * | 7/2003 | Yamamoto | 372/43 |

* cited by examiner

Primary Examiner—Don Wong
Assistant Examiner—Leith A Al-Nazer
(74) Attorney, Agent, or Firm—Smith, Gambrell & Russell, LLP

(57) ABSTRACT

An external cavity semiconductor laser comprises a grating fiber and a semiconductor optical amplification element. The grating fiber has a Bragg grating and an optical waveguide. The Bragg grating has a frequency $f_{FG}$ and exhibits a maximum reflectivity thereat. The Bragg grating is optically coupled to the optical waveguide. In the external cavity semiconductor laser. The grating fiber is determined such that an oscillation frequency $f_{LD}$ satisfies $$0 < f_{FG} - f_{LD} < 20 \text{ GHz} \qquad (1)$$

According to the structure of the external cavity semiconductor laser, the occurrence of mode hopping is reduced within a frequency range defined by expression (1).

44 Claims, 18 Drawing Sheets

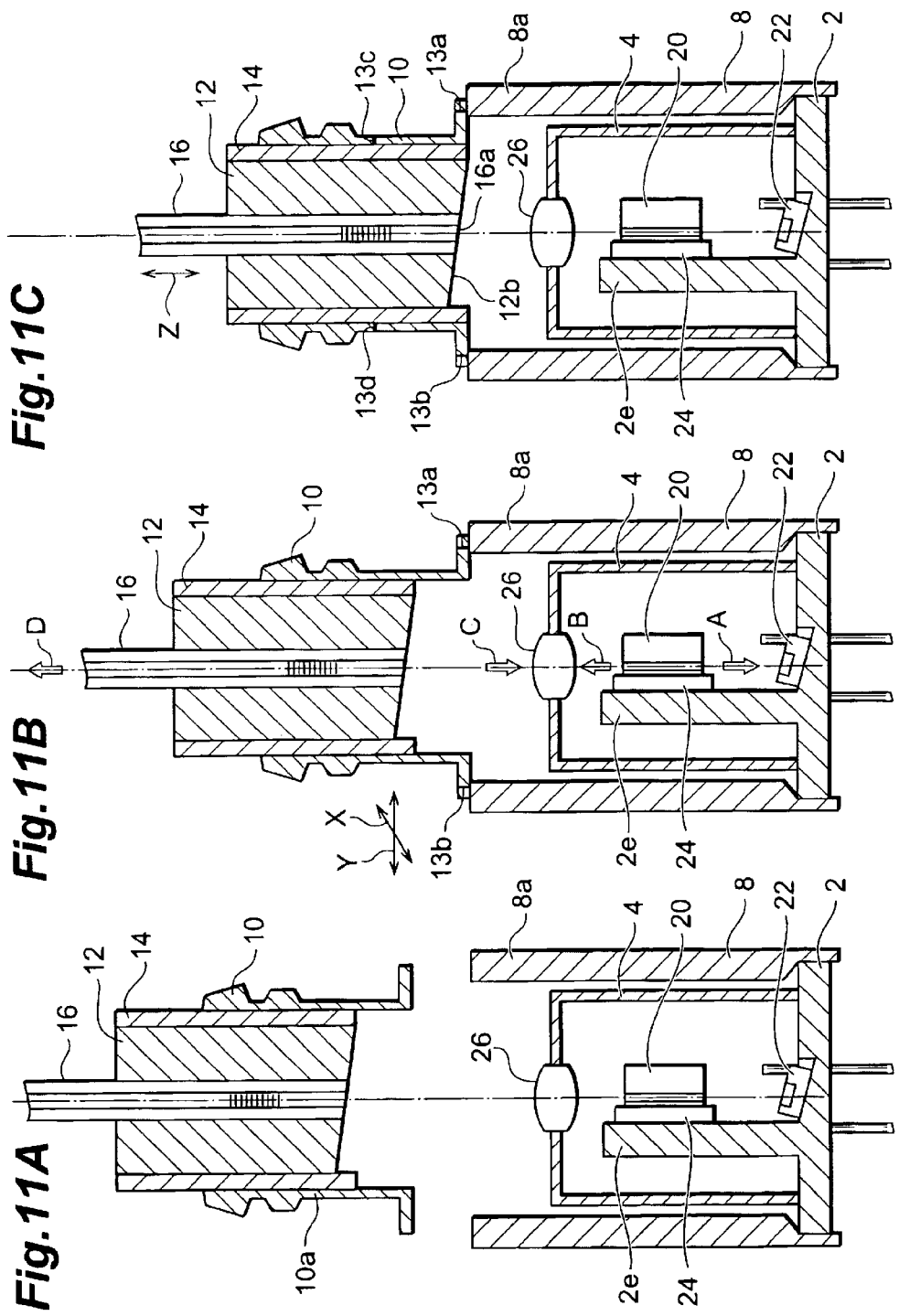

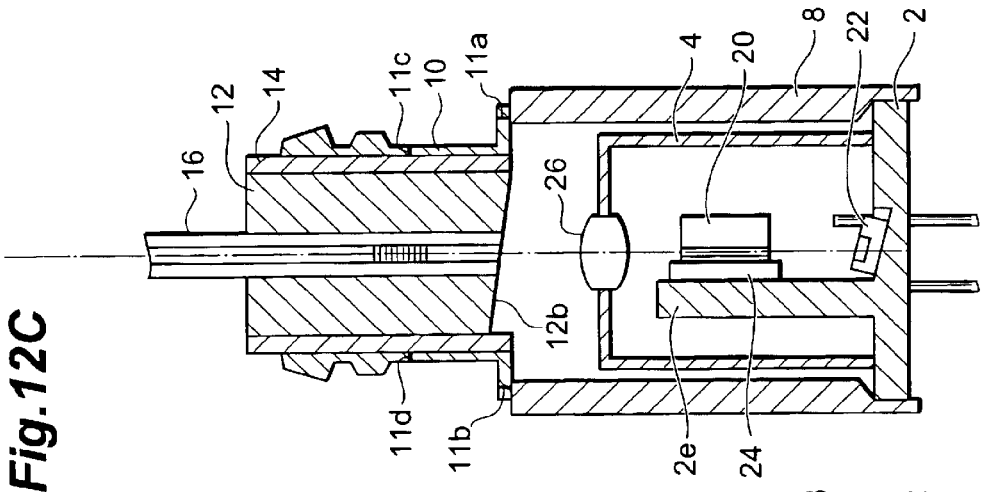
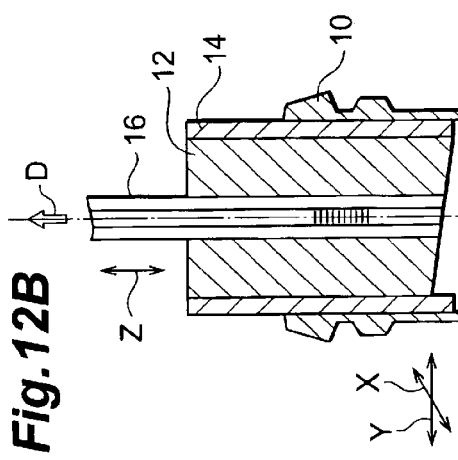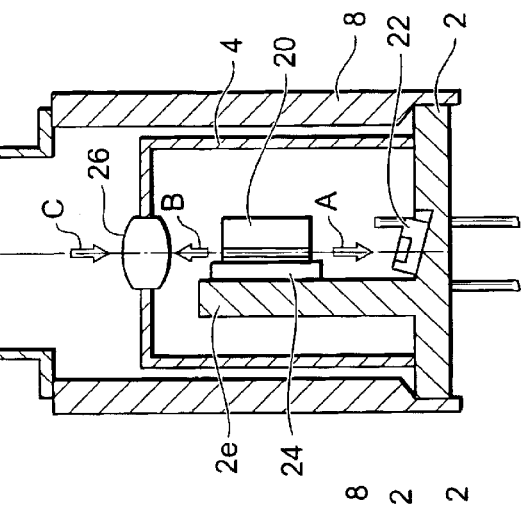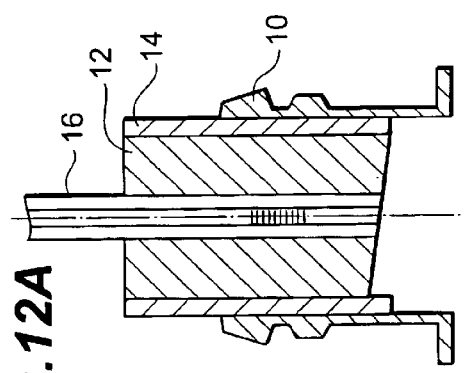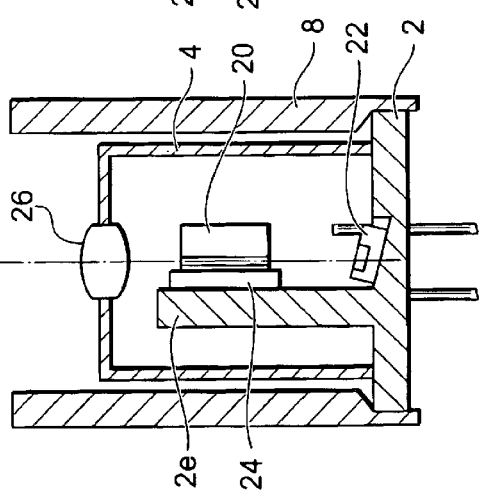
Fig.12A  Fig.12B  Fig.12C

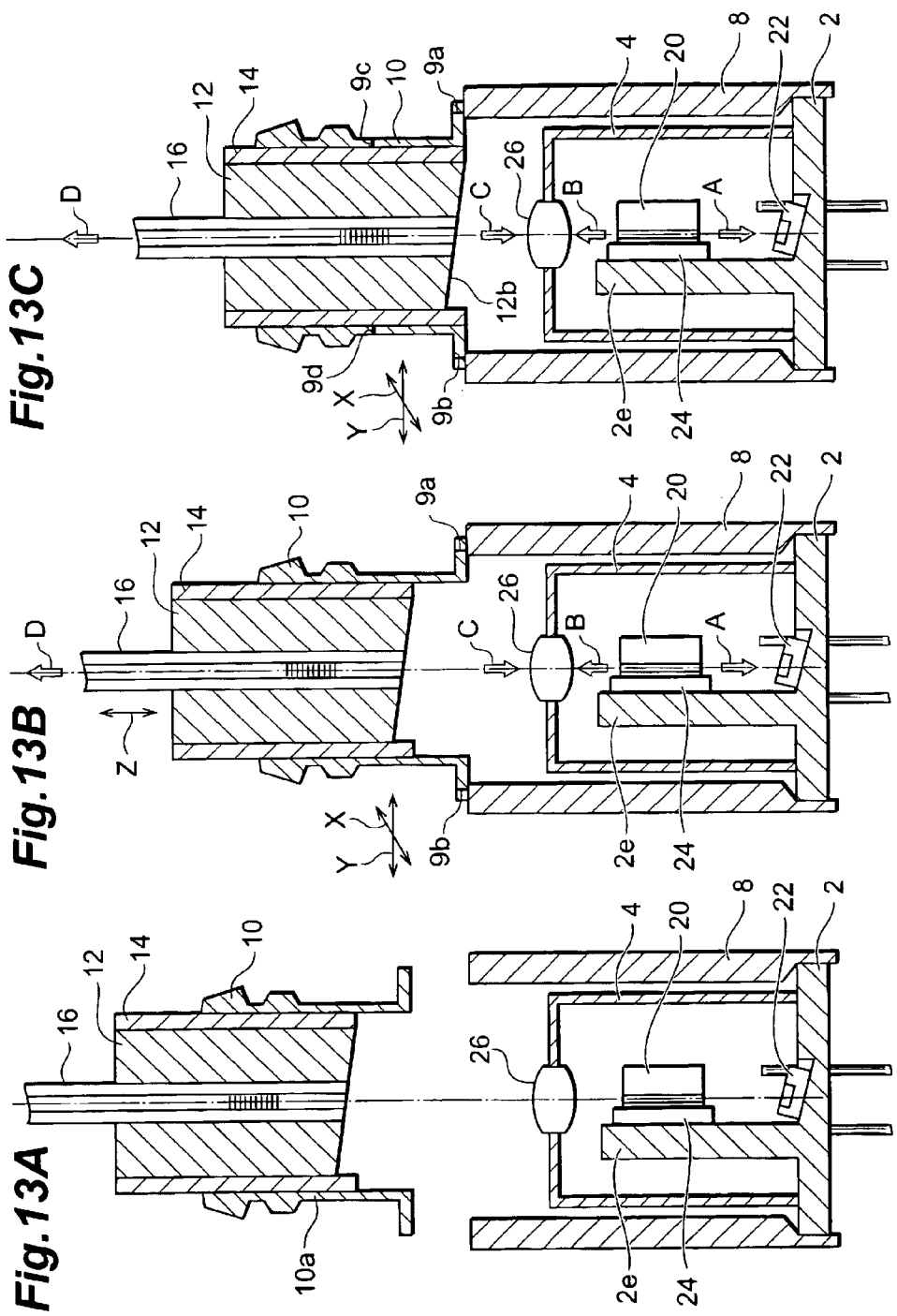

METHOD OF MANUFACTURING AN EXTERNAL CAVITY SEMICONDUCTOR LASER, EXTERNAL CAVITY SEMICONDUCTOR LASER, AND WAVELENGTH MULTIPLEX TRANSMISSION SYSTEM

CROSS-REFERENCE TO RELATED APPLICATION

This application claims priority to Provisional Application Ser. No. 60/318,333 filed on Sep. 12, 2001, which is hereby incorporated by reference in its entirety.

BACKGROUND OF THE INVENTION

1. Field of the Invention

The present invention relates to a method of manufacturing an external cavity semiconductor laser, an external cavity semiconductor laser, and a wavelength multiplex transmission system.

2. Related Background Art

A semiconductor laser generates light having a desired wavelength. Such a semiconductor laser is used as a light source for optical communications. In optical communications, WDM communication is implemented using a plurality of semiconductor lasers for generating optical signals having respective wavelength components.

SUMMARY OF THE INVENTION

An example of semiconductor lasers is an external cavity semiconductor laser. The external cavity semiconductor laser has a grating fiber and a semiconductor optical amplification element. In order to obtain a stable optical output, the external cavity semiconductor laser comprises a thermoelectronic element for temperature control and a control circuit for controlling the thermoelectronic element.

If an external cavity semiconductor laser does not include a Peltier element for controlling the temperature of the semiconductor optical amplification element, the length of the optical path, i.e., the optical cavity length, is changed due to variations of ambient temperatures or injected currents. This change causes a phenomenon, i.e., mode hopping, wherein the longitudinal mode discontinuously changes. Consequently, a so-called kink appears in the I-L characteristic (current vs. optical output characteristic). At the kink, the optical output of the semiconductor laser discontinuously changes, so that the use of such a semiconductor laser degrades the transmission quality.

Therefore, it is an object of the present invention to provide a method of manufacturing an external cavity semiconductor laser capable of reducing the occurrence of kinks, an external cavity semiconductor laser, and a wavelength multiplex transmission system.

An aspect of the present invention is a method of manufacturing an external cavity semiconductor laser. This method comprises the steps of: (a) providing an optical waveguide device and a semiconductor optical amplification element along a predetermined axis, the optical waveguide device having an optical waveguide and a Bragg grating exhibiting a maximum reflectivity at a frequency $f_{FG}$; and (b) arranging the optical waveguide and the semiconductor optical amplification element while monitoring a frequency $f_{LD}$ and intensity of light from an optical system including the semiconductor optical amplification element and the optical waveguide device.

In this method, the step of providing the optical waveguide and the semiconductor optical amplification element can include a step of adjusting a distance along the predetermined axis between the optical waveguide device and the semiconductor optical amplification element such that the oscillation frequency $f_{LD}$ satisfies:

$$0 < f_{FG} - f_{LD} < 20 \text{ GHz}.$$

Another aspect of the present invention is a method of manufacturing an external cavity semiconductor laser. This method comprises the steps of: (a) preparing an optical waveguide device and a semiconductor optical amplification element, the optical waveguide device having an optical waveguide and a Bragg grating exhibiting a maximum reflectivity at a wavelength $\lambda_{FG}$; and (b) arranging the optical waveguide and the semiconductor optical amplification element while monitoring a wavelength $\lambda_{LD}$ and intensity of light from an optical system including the semiconductor optical amplification element and the optical waveguide device.

In this method, the arrangement is carried out such that the wavelength $\lambda_{LD}$ satisfies:

$$0 < \lambda_{LD} - \lambda_{FG} < 0.16 \text{ nanometers}.$$

Still another aspect of the present invention is a method of manufacturing an external cavity semiconductor laser. The external cavity semiconductor laser comprises a grating fiber and a semiconductor amplification element. This method comprises the steps of (a) preparing a semiconductor optical amplification element and a grating fiber, the semiconductor optical amplification element being mounted on a stem, the grating fiber having a maximum reflectivity at a frequency $f_{FG}$; and (b) arranging the semiconductor optical amplification element and the grating fiber while energizing the semiconductor optical amplification element through the stem and monitoring a frequency $f_{LD}$ and intensity of light from an optical system including the semiconductor optical amplification element and the grating fiber.

In this method, the arrangement can be carried out such that the oscillation frequency $f_{LD}$ satisfies:

$$0 < f_{FG} - f_{LD} < 20 \text{ GHz}.$$

Still another aspect of the present invention is a method of manufacturing an external cavity semiconductor laser. The external cavity semiconductor laser comprises a grating fiber and a semiconductor amplification element. This method comprises the steps of (a) preparing a semiconductor optical amplification element mounted on a stem and a grating fiber having a maximum reflectivity at a wavelength $\lambda_{FG}$; and (b) arranging the semiconductor optical amplification element and the grating fiber while energizing the semiconductor optical amplification element through the stem and monitoring a wavelength $\lambda_{LD}$ and intensity of light from an optical system including the semiconductor optical amplification element and the grating fiber.

In this method, the arrangement is carried out such that the wavelength $\lambda_{LD}$ satisfies:

$$0 < \lambda_{LD} - \lambda_{FG} < 0.16 \text{ nanometers}.$$

Still another aspect of the present invention is an external cavity semiconductor laser. The external cavity semiconductor laser has a temperature-uncontrolled-type structure and is capable of generating light having an oscillation frequency $f_{LD}$. The external cavity semiconductor laser comprises an optical waveguide device and semiconductor optical amplification element. The optical waveguide device has a Bragg grating and an optical waveguide, the Bragg grating having a reflection spectrum with a maximum reflectivity at a frequency $f_{FG}$, and the Bragg grating being optically coupled to the optical waveguide. The semiconductor optical amplification element is optically coupled to the optical waveguide such that the oscillation frequency $f_{LD}$ satisfies:

$$0 < f_{FG} - f_{LD} < 20 \text{ GHz}.$$

An external cavity semiconductor laser of the present invention is capable of generating light having an oscillation frequency $f_{LD}$. The external cavity semiconductor laser comprises a semiconductor substrate, a semiconductor optical amplification element, an optical waveguide device, and a Bragg grating. The semiconductor optical amplification element is provided on the semiconductor substrate. The optical waveguide device is provided on the semiconductor substrate and is optically coupled to the semiconductor optical amplification element. The Bragg grating is provided on the semiconductor substrate and is optically coupled to the optical waveguide. The Bragg grating has a spectrum exhibiting a maximum reflectivity at a frequency $f_{FG}$. The semiconductor optical amplification element and the Bragg grating are arranged such that the oscillation frequency $f_{LD}$ satisfies:

$$0 < f_{FG} - f_{LD} < 20 \text{ GHz}.$$

An external cavity semiconductor laser of the present invention is capable of generating light having an oscillation frequency $f_{LD}$. The external cavity semiconductor laser comprises a substrate, an optical waveguide, a Bragg grating, and a semiconductor optical amplification element. The substrate includes at least one of $LiNbO_3$ and $LiTaO_3$. The optical waveguide is provided on the semiconductor substrate. The Bragg grating is provided on the semiconductor substrate and optically coupled to the optical waveguide. The Bragg grating has a spectrum exhibiting a maximum reflectivity at a frequency $f_{FG}$. The semiconductor optical amplification element is optically coupled to the optical waveguide. The semiconductor optical amplification element and the Bragg grating are arranged such that the oscillation frequency $f_{LD}$ satisfies:

$$0 < f_{FG} - f_{LD} < 20 \text{ GHz}.$$

An external cavity semiconductor laser of the present invention is capable of generating light having an oscillation frequency $f_{LD}$. The external cavity semiconductor laser comprises an optical waveguide device and a semiconductor optical amplification element. The optical waveguide device has a Bragg grating and an optical waveguide, the Bragg grating having a spectrum that exhibits a maximum reflectivity at a frequency $f_{FG}$, and an optical waveguide being optically coupled to the Bragg grating. The semiconductor optical amplification element is optically coupled to the optical waveguide. The optical cavity of this external cavity semiconductor laser is composed of the optical waveguide device and the semiconductor optical amplification element such that the oscillation frequency $f_{LD}$ satisfies:

$$0 < f_{FG} - f_{LD} < 20 \text{ GHz}.$$

An external cavity semiconductor laser of the present invention comprises a semiconductor optical amplification element, a stem, a grating fiber, and a spacer member. The semiconductor optical amplification element is mounted on the stem. The grating fiber has a Bragg grating exhibiting a reflection spectrum with a maximum reflectivity at a frequency $f_{FG}$. The spacer member separates the grating fiber from the semiconductor optical amplification element and defines a distance between the semiconductor optical amplification element and the grating fiber such that the oscillation frequency $f_{LD}$ satisfies:

$$0 < f_{FG} - f_{LD} < 20 \text{ GHz}.$$

An external cavity semiconductor laser of the present invention is capable of generating light having an oscillation frequency $f_{LD}$. The external cavity semiconductor laser comprises an optical waveguide device and a semiconductor optical amplification element. The optical waveguide device has a Bragg grating and an optical waveguide, the Bragg grating having a frequency $f_{FG}$ and exhibits the maximum reflectivity thereat, and the optical waveguide being optically coupled to the Bragg grating. The semiconductor optical amplification element is optically coupled to the optical waveguide device. The optical waveguide device and the semiconductor optical amplification element are arranged such that the oscillation frequency $f_{LD}$ satisfies:

$$0 < f_{FG} - f_{LD} < 20 \text{ GHz}.$$

Still another aspect of the present invention is a wavelength multiplex transmission system. The wavelength multiplex transmission system comprises a first external cavity semiconductor laser, a second external cavity semiconductor laser, and an optical transmission line. The optical transmission line has an end optically coupled to the first and the second external cavity semiconductor lasers. An oscillation frequency $f_{LD1}$ in the first external cavity semiconductor laser is different from an oscillation frequency $f_{LD2}$ in the second external cavity semiconductor laser.

BRIEF DESCRIPTION OF THE DRAWINGS

FIGS. 11A to 11C show an embodiment of the method of manufacturing an external cavity semiconductor laser.

FIGS. 12A to 12C show a modification of the method of manufacturing an external cavity semiconductor laser.

FIGS. 13A to 13C show another modification of the method for manufacturing an external cavity semiconductor laser.

Figure 1:
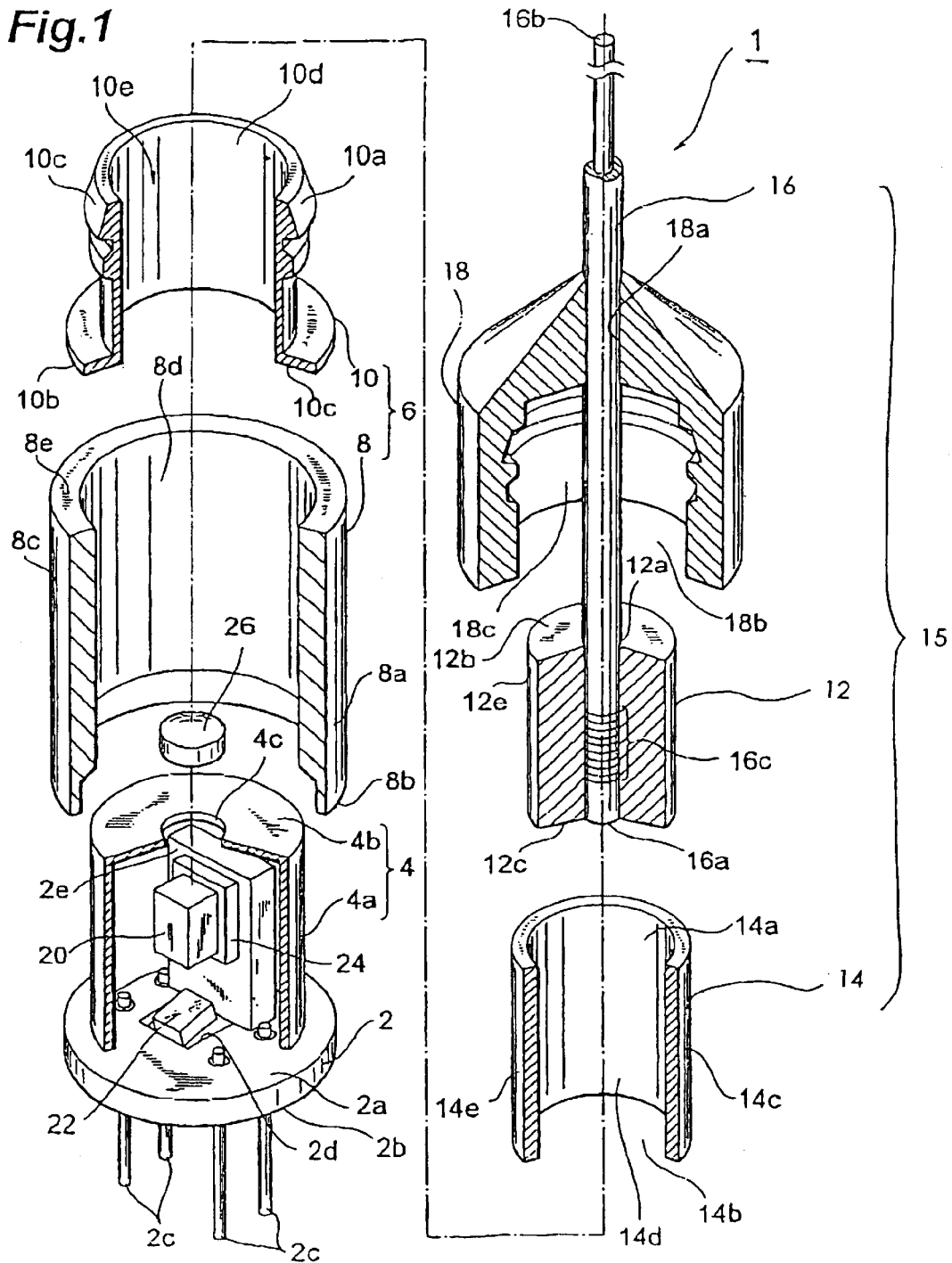
FIG. 1 is a view showing the components of an external cavity semiconductor laser according to the present embodiment.

The above object and other objects, features, and advantages of the present invention will easily be apparent from the following detailed description of preferred embodiments of the present invention with reference to the accompanying drawings.

DETAILED DESCRIPTION OF THE PREFERRED EMBODIMENTS

The teaching of the present invention can easily be understood by considering the following detailed description with reference to the accompanying drawings shown as examples. The external cavity semiconductor laser and the method of manufacturing the same according to the embodiments of the present invention will be explained hereinafter with reference to the accompanying drawings. The same reference numerals denote the same parts, if possible.

(The First Embodiment)

FIG. 1 is a view showing the components of an external cavity semiconductor laser according to the present embodiment. External cavity semiconductor laser 1 comprises mounting member 2, cover member 4, spacer member 6, optical waveguide device 15 and cap 18. Optical waveguide device 15 may include capillary 12, flange 14, and optical fiber 16. Mounting member 2 has mounting surface 2a and terminal surface 2b opposed to mounting surface 2a. Cover member 4 is provided on mounting surface 2a of mounting member 2 so as to cover semiconductor optical amplification element 20 and semiconductor light-receiving element 22. Cover member 4 has side wall portion 4a extending along a predetermined axis, and ceiling portion 4b provided at one end of side wall portion 4a. Ceiling portion 4b has opening portion 4c to receive an optical component, such as lens 26, therein. Mounting member 2 and cover member 4 constitute, e.g., a TO-type can case. In this external cavity semiconductor laser 1, semiconductor optical amplification element 20 is optically coupled to the optical waveguide device such that an oscillation frequency $f_{LD}$ satisfies:

$$0 < f_{FG} - f_{LD} < 20 \text{ GHz.} \quad (2)$$

With this arrangement, the occurrence of mode hopping may be reduced in external cavity semiconductor laser 1. Because of the above-mentioned coupling, a thermoelectronic cooling element, such as a Peltier element, cannot be included therein to reduce the occurrence of mode hopping. Hence, external cavity semiconductor laser 1 has an appropriate structure that realizes a temperature-uncontrolled-type external cavity semiconductor laser as shown in FIG. 1.

Referring to FIG. 1, in external cavity semiconductor laser 1, capillary 12 is a columnar member extending along a predetermined axis and has accommodation portion 12a to receive optical fiber 16 therein. Accommodation portion 12a extends from one end face 12b to the other end face 12c of capillary 12 along a predetermined direction and is provided as, e.g., a through hole.

Flange 14 has side wall 14c extending along a predetermined direction and opening portions 14a and 14b at both ends of side wall 14c. Flange 14 receives capillary 12 therein such that inner surface 14d of side wall 14c faces side surface 12e of capillary 12.

Optical fiber 16 has one end 16a and the other end 16b. Bragg grating 16c is provided in the core portion of optical fiber 16. Capillary 12 receives one end portion of optical fiber 16 therein while covering the portion of Bragg grating 16c. The one end 16a of optical fiber 16 appears on the other end face 12c of capillary 12. The remaining portion of optical fiber 16 extends from one end face 12b of capillary 12.

Cap 18 has insertion hole 18a through which optical fiber 16 passes, and accommodation portion 18b that accommodates second member 10, capillary 12, and flange 14. Insertion hole 18a extends from one end of cap 18 to accommodation portion 18b. Accommodation portion 18b has an inner surface shaped to fit on the outer side surface of second member 10.

Cover member 4 is provided on mounting surface 2a of mounting member 2. Spacer member 6 is provided on mounting surface 2a so as to surround cover member 4. Spacer member 6 is composed of first member 8 and second member 10. First member 8 has a wall portion 8a extending along a predetermined direction. One end portion 8b of wall portion 8a is provided on the peripheral portion of mounting surface 2a of mounting member 2. One end portion 8b of wall portion 8a has mounting surface 8e for mounting second member 10. Mounting surface 8e extends along a plane intersecting predetermined axis 30. Inner surface 8d of wall portion 8a defines a region to provide cover member 4. Second member 10 has wall portion 10a extending along a predetermined direction. One end portion 10b of wall portion 10a has slide surface 10c extending along a plane intersecting predetermined axis 30. Wall portion 10a is placed on first member 8 such that slide surface 10c faces mounting surface 8e. Inner surface 10d of wall portion 10a defines a region (hole 10e) to accommodate capillary 12 and flange 14.

Spacer member 6 is arranged on mounting member 2 and accommodates flange 12 and capillary 14. Thus, spacer member 6 can be employed to define the distance between semiconductor optical amplification element 20, mounted on mounting member 2, and grating fiber 16, held by capillary 12, to a desired value. In other words, the spacer member 6 functions as a spacer.

Mounting member 2 has a plurality of conductive terminals (lead terminals) 2c extending along a predetermined direction. Each of terminals 2c extends through mounting member 2 from terminal surface 2b to mounting surface 2a. Mounting surface 2a has a depression portion 2d to receive semiconductor light-receiving element 22 and columnar portion 2e to mount semiconductor optical amplification element 20 thereon. Semiconductor optical amplification element 20 is mounted on the side surface of columnar portion 2e through sub-mount 24. Semiconductor optical amplification element 20 and semiconductor light-receiving element 22 are electrically connected to terminals 2c through, e.g., bonding wires (not shown). Semiconductor optical amplification element 20 and semiconductor light-receiving element 22 are arranged on mounting member 2 such that semiconductor light-receiving element 22 can be optically coupled to semiconductor optical amplification element 20. In addition, semiconductor optical amplification element 20 is optically coupled to one end 16a of grating fiber 16 positioned by second member 10.

In this external cavity semiconductor laser 1, the optical waveguide device and semiconductor optical amplification element 20 is arranged to satisfy expression (2).

Figure 2:
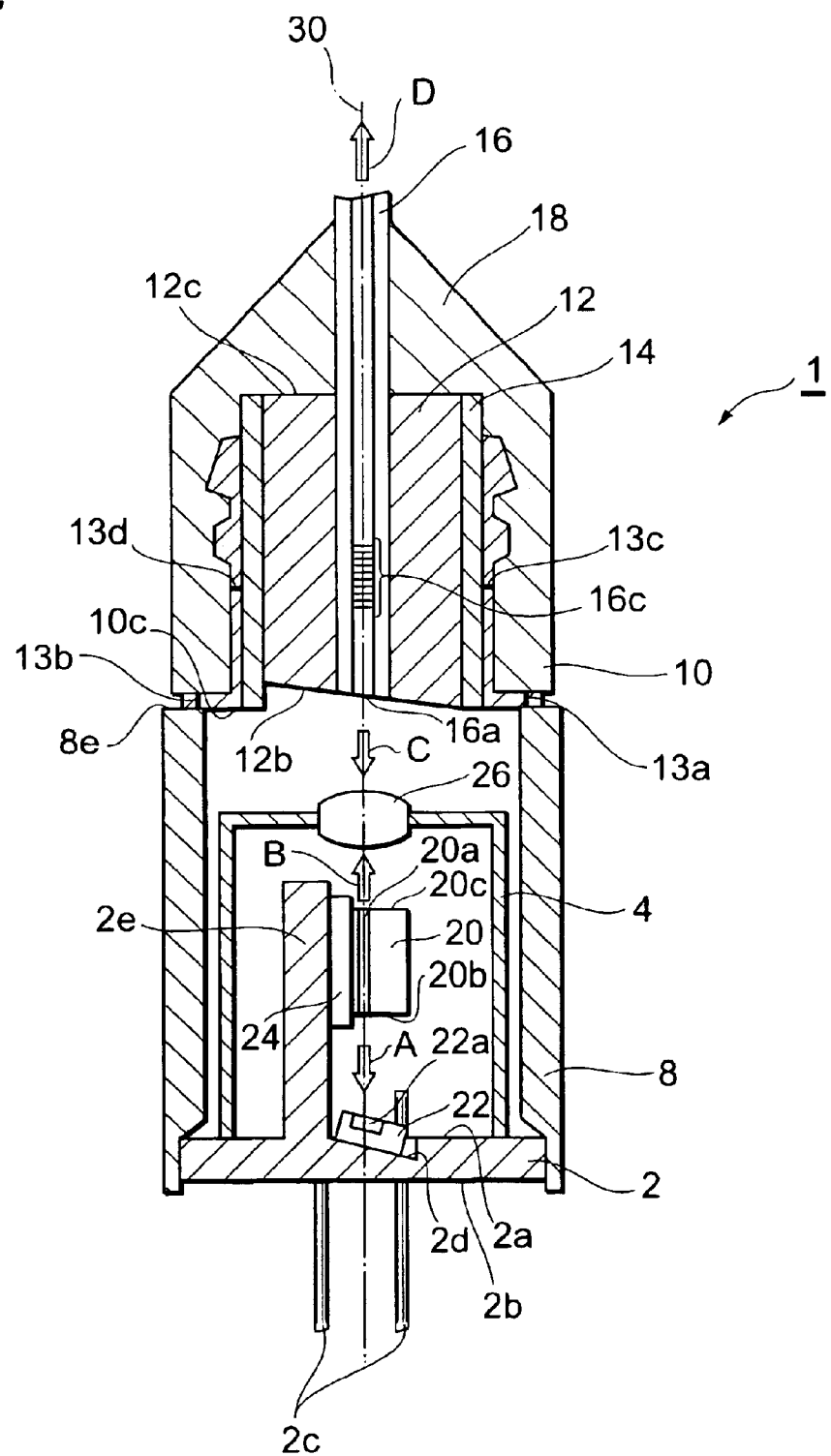
FIG. 2 is a sectional view showing the external cavity semiconductor laser according to the embodiment.

FIG. 2 shows an embodiment of an external cavity semiconductor laser provided by assembling the components shown in FIG. 1. Referring to FIG. 2, Bragg grating 16c, lens 26, semiconductor optical amplification element 20, and semiconductor light-receiving element 22 are arranged along axis 30. In particular, axis 30 is provided to pass through active layer 20a of semiconductor optical amplification element 20 and photoelectric conversion region 22a of semiconductor light-receiving element 22.

Semiconductor optical amplification element 20 has a pair of end faces 20b and 20c. These end faces are called the light-reflecting surface 20b and light-emitting surface 20c, respectively. One end of the optical fiber is optically coupled to the light-emitting surface 20c of the semiconductor optical amplification element.

Active layer 20a of semiconductor optical amplification element 20 extends from light-reflecting surface 20b to light-emitting surface 20c. The light reflectivity of light-reflecting surface 20b is greater than that of light-emitting surface 20c. The light reflectivity of light-emitting surface 20c is preferably 0.4% or less. The light reflectivity of light-reflecting surface 20b is preferably 30% or greater. In the example as shown in FIG. 2, end face 12b of capillary 12 is provided to extend along a plane tilting against axis 30, thus reducing the reflected light returned from end face 12b to semiconductor optical amplification element 20. According to the teaching of the present inventors, in this embodiment, an absolute value of the difference between a wavelength $\lambda_P$ at which the semiconductor optical amplification element exhibits the gain peak and a wavelength $\lambda_{FG}$ at which the Bragg grating exhibits the reflection peak is 30 nm or less.

Propagation of light generated in semiconductor optical amplification element 20 will be described as follows. Light-reflecting surface 20b faces semiconductor light-receiving element 22, and light A from light-reflecting surface 20b reaches photoelectric conversion region 22a, thus allowing semiconductor light-receiving element 22 to monitor the amount of light from semiconductor optical amplification element 20. Light-emitting surface 20c faces lens 26, and light B from light-emitting surface 20c reaches one end 16a of optical fiber 16 through lens 26 and then propagates in the core portion of optical fiber 16. Most of the propagating light is reflected by Bragg grating 16c and changes its direction. One end 16a of optical fiber 16 faces lens 26, and the reflected light therefrom becomes light C directed to lens 26 through one end portion 16a of optical fiber 16. Light C passes through the lens and reaches light-reflecting surface 20c of semiconductor optical amplification element 20. The remaining propagating light becomes light D that passes through Bragg grating 16c and is extracted from the optical module. As can be understood from the above description, in the external cavity semiconductor laser, the optical cavity is formed of light-reflecting surface 20b of semiconductor optical amplification element 20 and Bragg grating 16c. In other words, the optical cavity of the external cavity semiconductor laser is composed of Bragg grating 16c of the optical waveguide device and semiconductor optical amplification element 20. Thus, the cavity length of this optical cavity is determined such that the oscillation frequency $f_{LD}$ satisfies the relationship (2).

Figure 3:
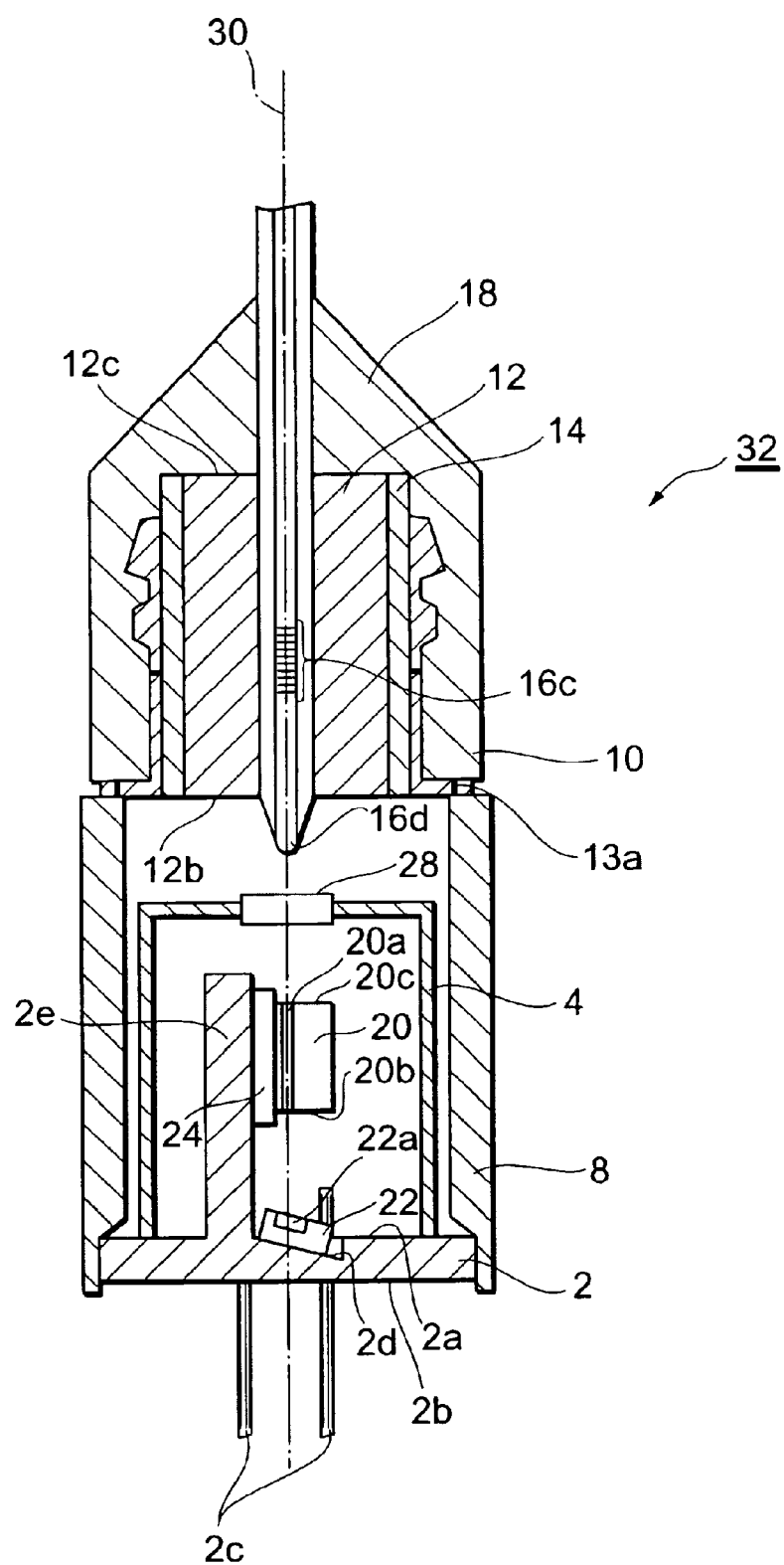
FIG. 3 is a sectional view showing another form of an external cavity semiconductor laser according to the embodiment.

FIG. 3 shows another embodiment of the external cavity semiconductor laser. In this embodiment, external cavity semiconductor laser 32 comprises hermetic glass 28 in place of lens 26, and has end portion 16d with a lens in place of end portion 16a of optical fiber 16.

(The Second Embodiment)

Figure 4:
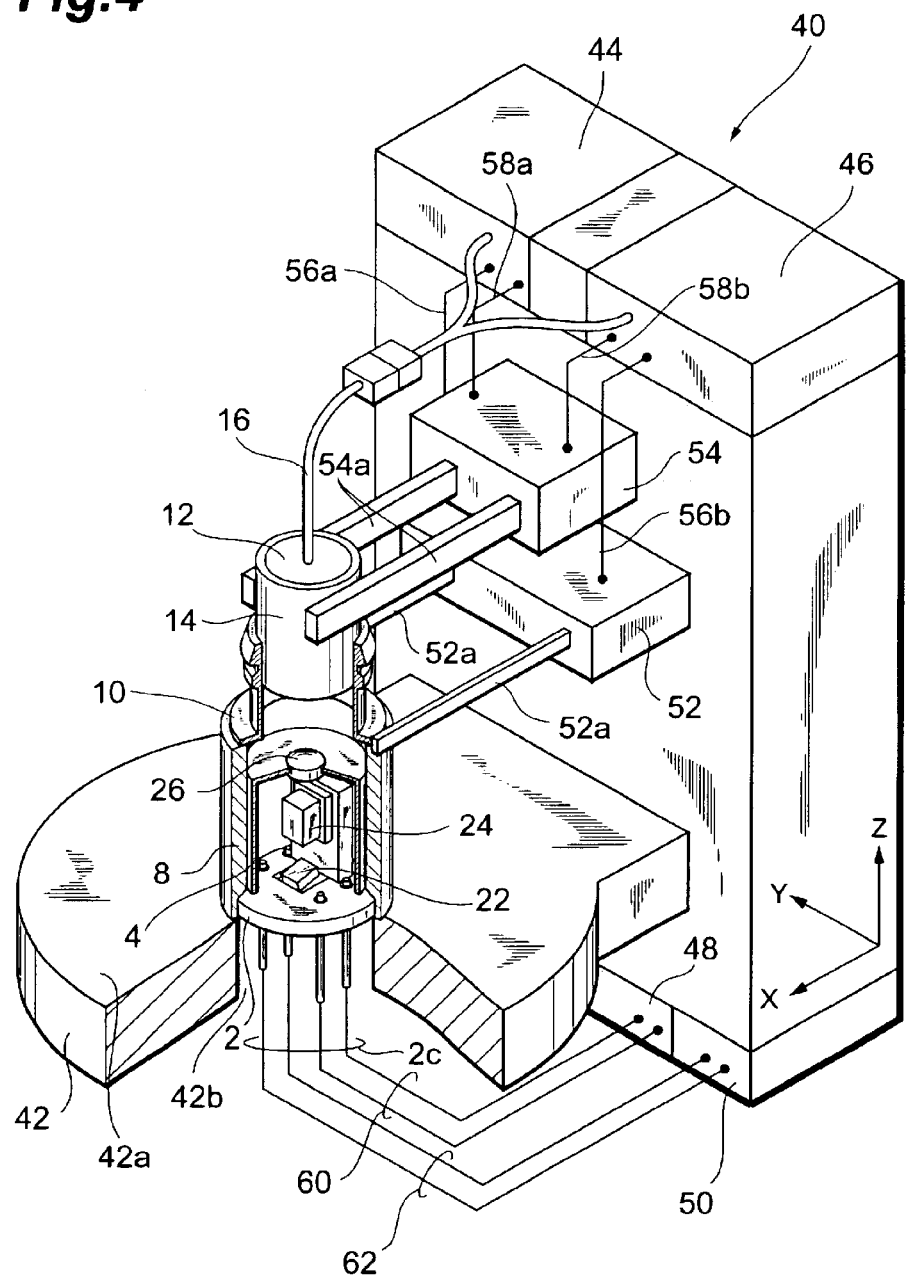
FIG. 4 is a schematic view showing an alignment apparatus for the optical alignment of an external cavity semiconductor laser.

FIG. 4 shows an alignment apparatus for the optical adjustment of the external cavity semiconductor laser. Alignment apparatus 40 comprises stage 42, optical power measurement section 44, optical wavelength measurement section (or optical frequency measurement section) 46, power supply device 48, photocurrent detection section 50, first drive unit 52, and second drive unit 54. Stage 42 has support surface 42a for supporting mounting member 2 of external cavity semiconductor laser 1, and hole 42b for receiving lead terminals 2c of mounting member 2. Optical power measurement section 44 is optically coupled to optical fiber 16 of external cavity semiconductor laser 1 to measure the intensity of light from external cavity semiconductor laser 1. Optical wavelength measurement section 46 is optically coupled to optical fiber 16 of external cavity semiconductor laser 1 to measure the wavelength (or the frequency) of light from external cavity semiconductor laser 1. Power supply device 48 is electrically connected to semiconductor optical amplification element 20 via lead terminals 2c of external cavity semiconductor laser 1 to supply driving power to semiconductor optical amplification element 20. Photocurrent detection section 50 is electrically connected to semiconductor light-receiving element 22 via lead terminals 2c of external cavity semiconductor laser 1 to receive a photocurrent from semiconductor light-receiving element 22. First and second drive units 52 and 54 can operate to move respective supported components in the X-, Y-, and Z-axis directions of the coordinate system shown in FIG. 4. First drive unit 52 has support arms 52a to support second member 10 and is connected to optical power measurement section 44 and optical wavelength measurement section 46 via signal lines 56a and 56b, respectively, to receive position adjustment signals from optical power measurement section 44 and optical wavelength measurement section 46. Second drive unit 54 has support arms 54a to support capillary 12 and flange 14, and is connected to optical power measurement section 44 and optical wavelength measurement section 46 via signal lines 58a and 58b, respectively, to receive position adjustment signals from optical power measurement section 44 and optical wavelength measurement section 46.

A method of manufacturing the external cavity semiconductor laser using this apparatus 40 will be described as follows. In the assembling process that will be explained hereinafter, the wavelength of is monitored, but the frequency of the light may also be monitored.

Assembly of Workpiece for External Cavity Semiconductor Laser

Semiconductor optical amplification element 20 and semiconductor light-receiving element 22 are placed on mounting member 2. Semiconductor optical amplification element 20 and semiconductor light-receiving element 22 are electrically connected to lead terminals 2c via, e.g., bonding wires. Cover member 4 is placed on mounting member 2 to cover the semiconductor optical amplification element 20 and semiconductor light-receiving element 22. Cover member 4 is provided with lens 26. First member 8 is placed on mounting member 2. With this process, the workpiece for the external cavity semiconductor laser is assembled.

Placement of Workpiece

The workpiece is placed on support surface 42a of alignment apparatus 40.

Optical fiber 16 is optically coupled to optical power measurement section 44 and optical wavelength measurement section 46. In order to supply electrical power to semiconductor optical amplification element 20, power supply device 48 is electrically connected to lead terminals 2c via wires 60. In order to monitor the optical power of semiconductor optical amplification element 20, photocurrent detection section 50 is electrically connected to lead terminals 2c via wires 62.

Positioning of Second Member

Second member 10 will be positioned on first member 8. Specifically, second member 10 is placed on first member 8 such that slide surface 10c of second member 10 faces mounting surface 8e. Capillary 12 and flange 14 are arranged in hole 10e of second member 10.

Semiconductor optical amplification element 20 is energized to emit light. The power of light from semiconductor optical amplification element 20 is measured by optical power measurement section 44 while moving second member 10 in X- or Y-direction on mounting surface 8e by use of first drive units 52 and/or second drive units 54. The position of second member 10 is determined according to the measurement results of optical power. After positioning, second member 10 is secured to first member 8. This securing can be carried out, e.g. by welding at predetermined portions (welded portions 13a and 13b in FIG. 2).

Positioning of Flange and Capillary

Flange 14 and capillary 12 will be positioned with respect to second member 10. They are placed on first member 8 such that inner surface 10d of second member 10 faces the side surface of flange 12. Therefore, capillary 12 and flange 14 have been arranged in hole 10e of second member 10.

Semiconductor optical amplification element 20 is energized to emit light. The wavelength of light from semiconductor optical amplification element 20 is measured by optical wavelength measurement section 46 while moving capillary 12 and flange 14 in the Z-axis direction by use of first and second drive units 52 and 54. In addition, the power of light from semiconductor optical amplification element 20 is measured by optical power measurement section 44.

In this process, semiconductor optical amplification element 20 may be optically coupled to the optical fiber such that the oscillation frequency $f_{LD}$ of external cavity semiconductor laser 1 satisfies:

$$0 < f_{FG} - f_{LD} < 20 \text{ GHz} \quad (3)$$

The arrangement of Bragg grating 16c and semiconductor optical amplification element 20 may be determined such that the oscillation frequency $f_{LD}$ of the external cavity semiconductor laser satisfies the above relationship. The optical cavity of the external cavity semiconductor laser is composed of Bragg grating 16c and semiconductor optical amplification element 20. The cavity length of this optical cavity may be determined such that the oscillation frequency $f_{LD}$ satisfies the above relationship. According to these examples, the occurrence of mode hopping phenomenon can be reduced in external cavity semiconductor laser 1.

After the arrangement is determined, flange 14 is secured to second member 10. This securing can be carried out, e.g., by welding at predetermined portions (welded portions 13c and 13d in FIG. 2). In this arrangement, optical fiber 16, such as a silica grating fiber, is separated from the semiconductor optical amplification element 20 by first and second members 8 and 10. First and second members 8 and 10 serve as spacers.

Thereafter, the external cavity semiconductor laser is detached from alignment apparatus 40. Rubber cap 18 is employed to cover second member 10. With the above steps, the external cavity semiconductor laser is completed.

Figure 5A:
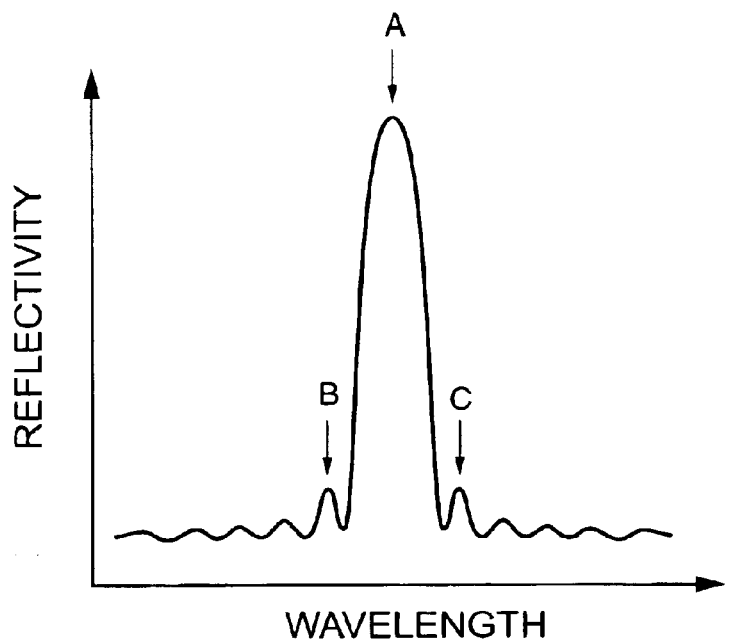
FIG. 5A is a graph showing the reflection spectrum of a Bragg grating included in the grating fiber shown in FIG. 1.
Figure 5B:
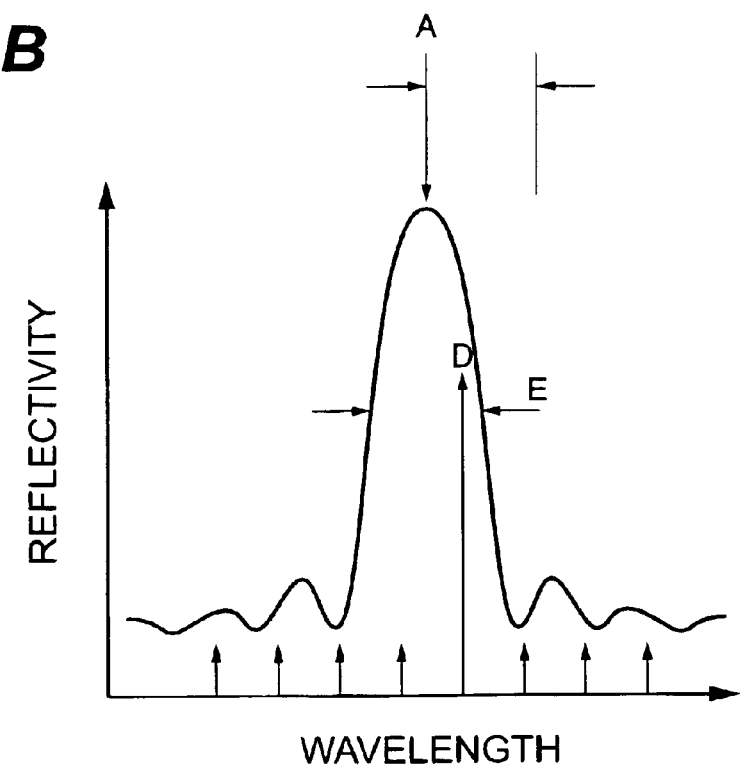
FIG. 5B is a graph showing the relationship between the oscillation frequency and the peak frequency in the embodiment.

FIG. 5A exemplifies the reflection spectrum of the Bragg grating included in the grating fiber of the external cavity semiconductor laser shown in FIG. 1. FIG. 5B is a graph showing the relationship between the oscillation frequency and the peak frequency according to this embodiment.

Referring to FIGS. 5A and 5B, the reflection spectrum exhibits the maximum reflectivity at a wavelength $\lambda_{FG}$ (frequency $f_{FG}$) indicated by Arrow A. As shown in FIG. 5A, side lobes (indicated by Arrows B and C) appear in upper and lower regions of this wavelength. According to an experiment conducted by the present inventors, the reflectivity of the side lobe is preferably 10% or less of the maximum reflectivity in the reflection spectrum of the Bragg grating. This prevents any oscillation at the reflection wavelength of the side lobe.

Referring to FIG. 5B, a number of arrows are arranged along the abscissa of the external cavity semiconductor laser and indicate the longitudinal modes. The full-width at half maximum of the reflection spectrum of the Bragg grating is larger than the spacing of the longitudinal modes. Among these longitudinal modes, the reflectivity in the mode indicated by Arrow D has the largest value as compared to the reflectivity in the remaining longitudinal modes. For this reason, the external cavity semiconductor laser oscillates laser in mode D. The oscillation frequency $f_{LD}$ (wavelength $\lambda_{LD}$) corresponding to this mode (Arrow D) satisfies $0 < f_{FG} - f_{LD} < 20$ GHz. According to this embodiment, in the external cavity semiconductor, laser, the arrangement of the semiconductor optical amplification element and the Bragg grating is determined such that the relationship between $f_{LD}$ and $f_{LD}$ is satisfied.

Figure 6:
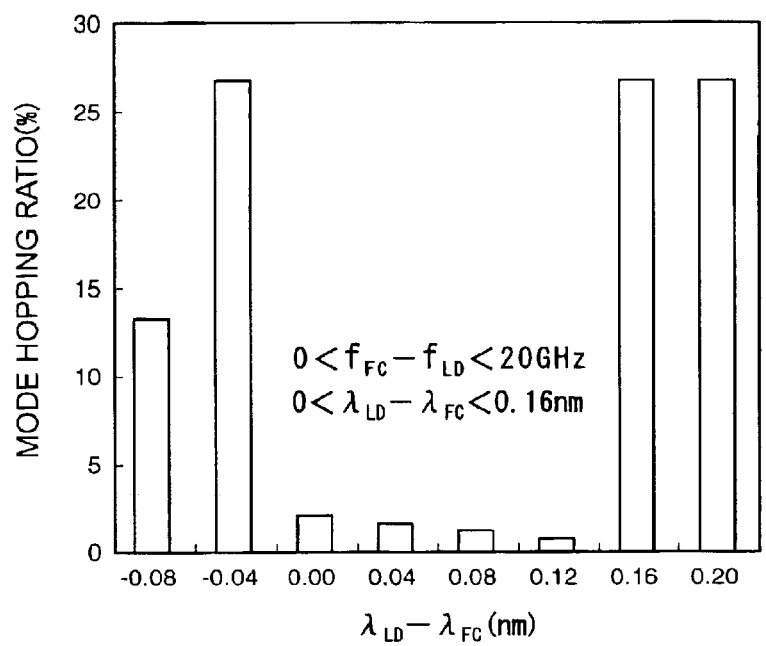
FIG. 6 is a graph showing the experimental data of the external cavity semiconductor laser shown in FIG. 2.

FIG. 6 is a graph showing the experimental data of an external cavity semiconductor laser as shown in FIG. 2. A 1.55 micrometers wavelength band external cavity semiconductor laser has been used to measure experimental data. The ordinate represents the mode hopping ratio (%) of the external cavity semiconductor laser, and the abscissa represents $\lambda_{LD} - \lambda_{FG}$ in the unit of nanometer. According to FIG. 6, the mode hopping ratios in $\lambda_{LD} - \lambda_{FG} = 0.00, 0.04, 0.08$, and 0.12 nm are lower than those in $\lambda_{LD} - \lambda_{FG} = -0.08, -0.04$, 0.16, and 1.20 nm. In addition, the mode hopping ratios in $\lambda_{LD} - \lambda_{FG} = 0.04, 0.08$, and 0.12 nm are lower than the mode hopping ratio in $\lambda_{LD} - \lambda_{FG} = 0.00$ nm. Obviously, the external cavity semiconductor laser exhibits an excellent mode hopping ratios within the range of 0 nm$<\lambda_{LD} - \lambda_{FG}<0.16$ nm ($0 < f_{FG} - f_{LD} < 20$ GHz) Additionally, the mode hopping ratios in $\lambda_{LD} - \lambda_{FG} = 0.08$ and 0.12 nm are lower than the mode hopping ratio in $\lambda_{LD} - \lambda_{FG} = 0.04$ nm. Furthermore, the mode hopping ratio in $\lambda_{LD} - \lambda_{FG} = 0.12$ nm is lower than that in $\lambda_{LD} - \lambda_{FG} = 0.08$ nm.

Figure 7:
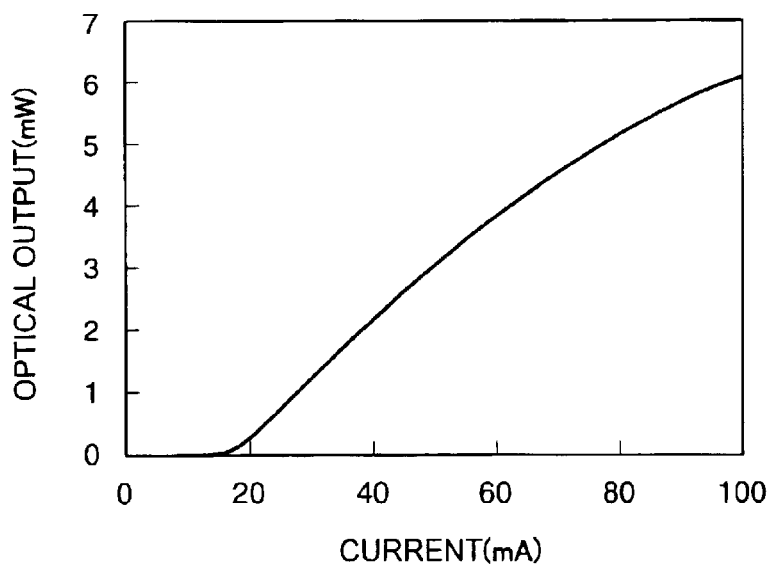
FIG. 7 is a graph showing the current vs. light intensity characteristic of an external cavity semiconductor laser, as shown in FIG. 2, exhibiting a low mode hopping ratio.
Figure 8:
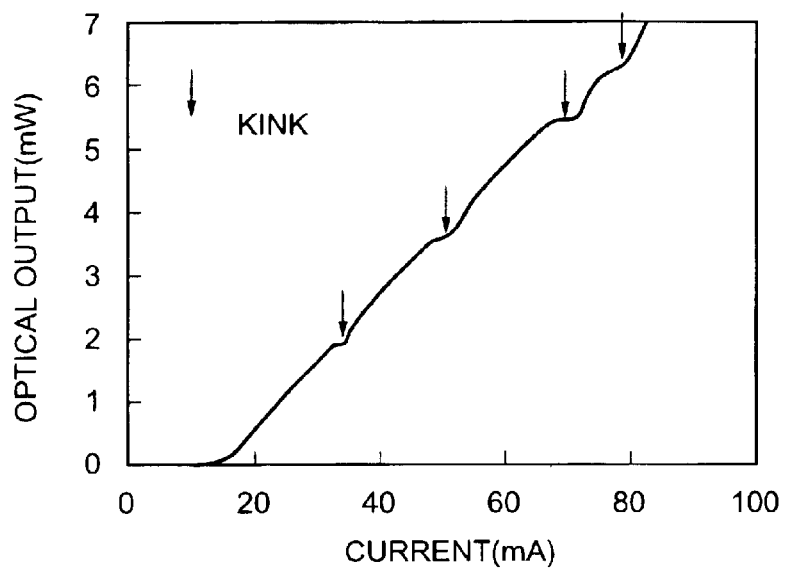
FIG. 8 is a graph showing the current vs. light intensity characteristic of an external cavity semiconductor laser in which mode hopping occurs.

FIG. 7 is a graph showing the current (mA) vs. light intensity (mW) characteristic of the external cavity semiconductor laser, as shown in FIG. 2, exhibiting a lower mode hopping ratio. FIG. 8 is a graph showing the current (mA) vs. light intensity (mW) characteristic of an external cavity semiconductor laser that causes mode hopping. The current vs. light intensity characteristic shown in FIG. 7 is represented by a smooth curve. However, the current vs. light intensity characteristic shown in FIG. 8 has a number of kinks at positions indicated by arrows, and mode hopping occurs thereat.

Figure 9:
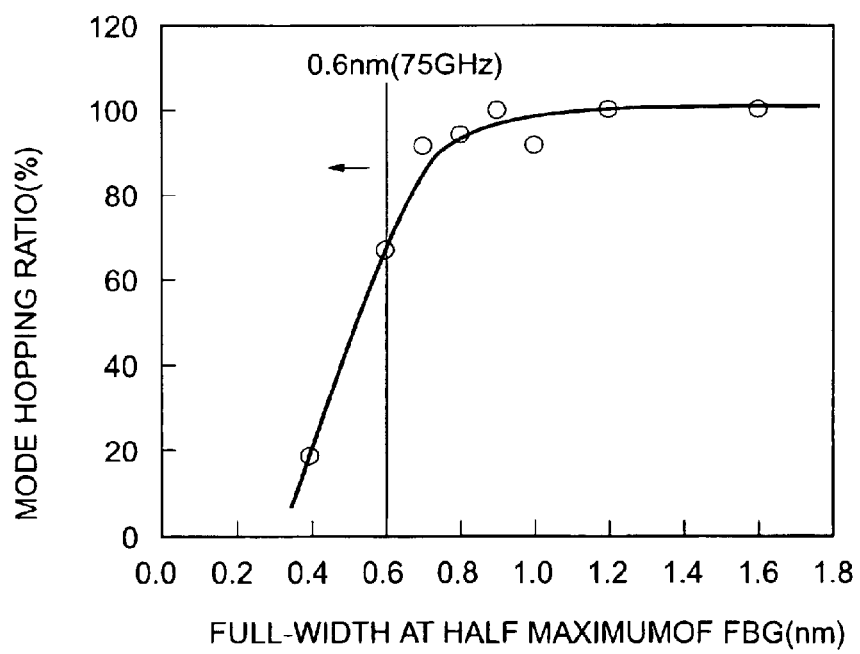
FIG. 9 is a graph showing the experimental data of the external cavity semiconductor laser.

FIG. 9 is a graph showing the experimental data of the external cavity semiconductor laser. Referring to FIG. 9, the abscissa represents the full-width at half maximum (nanometer) of the Bragg grating (FBG), and the ordinate represents the mode hopping ratio (%). According to the experimental data shown in FIG. 9, when the full-width at half maximum of the reflection spectrum of the Bragg grating becomes about 0.8 nm, the mode hopping ratio tends to become lower. When the full-width at half maximum is 0.6 nm (frequency: 75 GHz), a lower mode hopping ratio is obtained. Therefore, the full-width at half maximum is preferably 0.6 nm or less.

Figure 10:
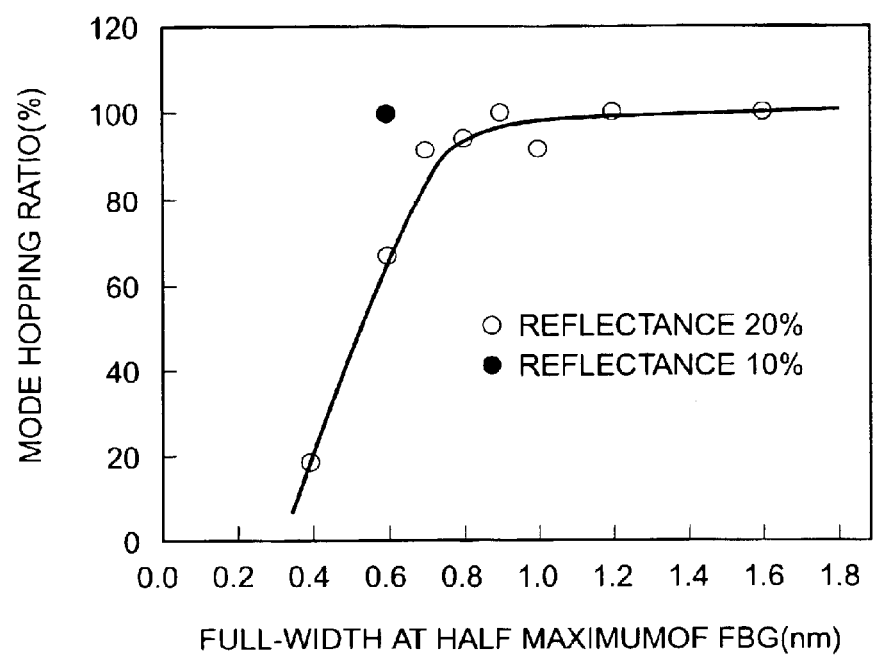
FIG. 10 is a graph showing the experimental data of the external cavity semiconductor laser.

FIG. 10 is a graph showing the experimental data of external cavity semiconductor lasers. Referring to FIG. 10, the abscissa represents the full-width at half maximum (in nanometer) of the Bragg grating (FBG), and the ordinate represents the mode hopping ratio (%). Referring to FIG. 10, the symbol "○" indicates the mode hopping ratio (%) of an external cavity semiconductor laser having a Bragg grating with a maximum reflectivity of 20%, and the symbol "●" indicates the mode hopping ratio (%) of an external cavity semiconductor laser having a Bragg grating with a maximum reflectivity of 10%. According to the result shown in FIG. 10, the mode hopping ratio (%) in the maximum reflectivity of 20% is better than that in the maximum reflectivity of 10%. Therefore, it is preferable that the Bragg grating have a maximum reflectivity at least higher than 10%.

(The Third Embodiment)

Subsequently, a modification of the method of manufacturing the external cavity semiconductor laser will be described. In this method, the external cavity semiconductor laser can be manufactured by employing, but not limited to, the alignment apparatus shown in FIG. 4. X-, Y- and Z-axes in this embodiment comply with the coordinate system shown in FIG. 4.

FIGS. 11A to 11C show an embodiment of the method of manufacturing the external cavity semiconductor laser. As shown in FIG. 11A, grating fiber 16 and semiconductor optical amplification element 20 are aligned along a predetermined direction of axis 30. In FIG. 11A, first member 8 having side wall portion 8a extending along the predetermined axial direction is mounted on mounting member 2, such as a stem. Grating fiber 16 is received by second member 10 having side wall portion 10a extending in the predetermined direction of axis 30.

In the alignment step, grating fiber 16 and semiconductor optical amplification element 20 are preliminarily arranged such that laser light (light A, B, C and D shown in FIG. 11B) is generated by an optical system composed of grating fiber 16 and semiconductor optical amplification element 20.

As shown in FIG. 11B, the first arrangement is determined while moving one member of first member 8 and second member 10 with respect to the other member along a plane (X- and Y-directions in FIG. 11B) intersecting the predetermined axis 30. After determining the first arrangement, the optical system composed of grating fiber 16 and semiconductor optical amplification element 20 provides the maximum value in the intensity of laser light D therefrom. With this arrangement maintained, first member 8 and second member 10 are secured to one another. This securing is realized by laser welding with YAG laser to form welded portions 13a and 13b.

As shown in FIG. 11C, the second arrangement can be determined while moving one member of first member 8 and second member 10 with respect to the other member along the direction of predetermined axis 30 (Z-direction in FIG. 1C). In the second arrangement, the oscillation frequency $f_{LD}$ of laser light D from the optical system composed of grating fiber 16 and semiconductor optical amplification element 20 satisfies:

$$0 < f_{FG} - f_{LD} < 20 \text{ GHz; or}$$

the oscillation wavelength $\lambda_{LD}$ of laser light D satisfies:

$$0 < \lambda_{LD} - \lambda_{FG} < 0.16 \text{ nanometers.}$$

With this arrangement maintained, second member 10 and flange 14, supporting grating fiber 16 through capillary 12, are secured to one another. This securing is realized by forming welded portions 13c and 13d with laser welding by YAG laser. After this securing, longitudinal modes of the external cavity semiconductor laser are determined.

FIGS. 12A to 12C show a modification of the method of manufacturing the external cavity semiconductor laser. As shown in FIG. 12A, grating fiber 16 and semiconductor optical amplification element 20 are aligned along a predetermined direction of axis 30. In FIG. 12A, first member 8 having side wall portion 8a extending in the predetermined axial direction is mounted on mounting member 2, such as a stem. Grating fiber 16 is received by second member 10 having side wall portion 10a extending in the predetermined direction of axis 30.

In the alignment step, grating fiber 16 and semiconductor optical amplification element 20 are preliminarily arranged such that laser light (light A, B, C and D shown in FIG. 12B) is generated by an optical system composed of grating fiber 16 and semiconductor optical amplification element 20.

As shown in FIG. 12B, this arrangement can be determined by moving one member of first member 8 and second member 10 with respect to the other member along a plane (X- and Y-directions in FIG. 12B) intersecting the predetermined axis 30 and by moving one member of grating fiber 16 and semiconductor optical amplification element 20 with respect to the other member in the direction (Z-direction in FIG. 12B) of the predetermined axis 30. In this arrangement, the optical system composed of grating fiber 16 and semiconductor optical amplification element 20 exhibits the maximum value in the intensity of laser light D therefrom. Further, in this arrangement, the oscillation frequency $f_{LD}$ of laser light D from the optical system satisfies:

$$0 < f_{FG} - f_{LD} < 20 \text{ GHz.}$$

As shown in FIG. 12C, first member 8 and second member 10 are secured to one another with this arrangement maintained. This first securing is realized by laser welding with YAG laser to form welded portions 11a and 11b. Second member 10 and flange 14 that supports grating fiber 16 through capillary 12 are secured to one another. This second securing is realized by laser welding with YAG laser to form welded portions 13c and 13d. The securing determines the longitudinal modes of the external cavity semiconductor laser. The order of the first and the second securing steps is changeable.

The method of this embodiment can comprises the steps of: prior to the securing, aligning first member 8 and second member 10 with one another; aligning grating fiber 16 and second member 10 with one another; and repeating these steps.

FIGS. 13A to 13C show another modification of the method of manufacturing the external cavity semiconductor laser. As shown in FIG. 13A, grating fiber 16 and semiconductor optical amplification element 20 are aligned along a predetermined direction of axis 30. In FIG. 13A, first member 8 having side wall portion 8a extending in the predetermined axial direction is mounted on mounting member 2, such as a stem. Grating fiber 16 is provided in second member 10 having the side wall portion 10a extending in the predetermined direction of axis 30.

In the alignment step, grating fiber 16 and semiconductor optical amplification element 20 are preliminarily arranged such that an optical system composed of grating fiber 16 and semiconductor optical amplification element 20 generates laser light (light A, B, C and D shown in FIG. 13B) therefrom.

As shown in FIG. 13B, the first arrangement is determined by moving one member of first member 8 and second member 10 with respect to the other member along a plane (X- and Y-directions in FIG. 13B) intersecting the predetermined axis 30 and by moving one member of grating fiber 16 and semiconductor optical amplification element 20 with respect to the other member in the direction (Z-direction in FIG. 13B) of the predetermined axis 30. In this first arrangement, an optical system composed of grating fiber 16 and semiconductor optical amplification element 20 provides the maximum value in the intensity of laser light D therefrom. Further, in this first arrangement, the oscillation frequency $f_{LD}$ of laser light D from the optical system satisfies $0 < f_{FG} - f_{LD} < 20$ GHz.

While being kept in this arrangement, second member 10 and flange 14 that supports grating fiber 16 via capillary 12 are secured to one another. This securing is realized by laser welding with YAG laser to form welded portions 9a and 9b. By this securing, the longitudinal modes of the external cavity semiconductor laser are determined.

As shown in FIG. 13C, the second arrangement is determined by relatively moving one member of first member 8 and second member 10 with respect to the other member along a plane (X- and Y-directions in FIG. 13C) intersecting the predetermined axis 30. This alignment serves as fine adjustment in X- and Y-directions. In the second arrangement, the optical system exhibits the maximum value in the intensity of laser light D therefrom. With this arrangement maintained, first member 8 and second member 10 are secured to one another. This securing is realized by laser welding with YAG laser to form welded portions 9a and 9b.

Figure 14A:
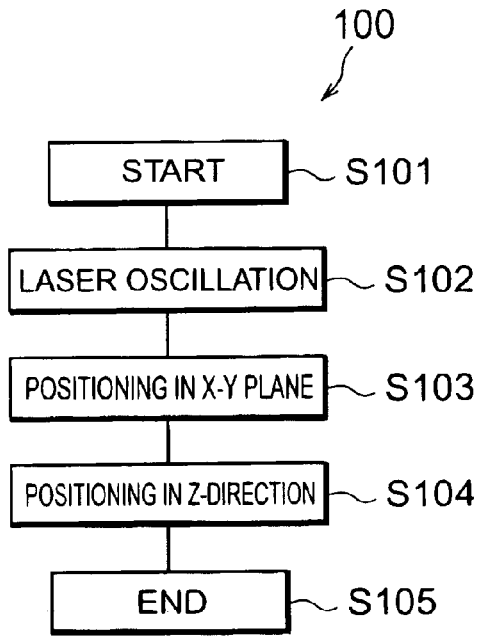
FIG. 14A is a flowchart showing the method of manufacturing an external cavity semiconductor laser.

FIG. 14A is flowchart 100 showing the method of manufacturing the external cavity semiconductor laser. Referring to FIG. 14A, the flowchart for alignment starts with step S101. In step S102, grating fiber 16 and semiconductor optical amplification element 20 are preliminary arranged such that laser light is generated by the optical system composed of grating fiber 16 and semiconductor optical amplification element 20. In step S103, the arrangement of grating fiber 16 and semiconductor optical amplification element 20 is determined by measuring the intensity of the laser light from the optical system while relatively moving grating fiber 16 and semiconductor optical amplification element 20 along a plane intersecting the predetermined axis. In this arrangement, the optical system exhibits the maximum value in the intensity of the laser light therefrom. In step S104, the arrangement of grating fiber 16 and semiconductor optical amplification element 20 is determined by measuring the wavelength or frequency of the laser light from the optical system while relatively moving grating fiber 16 and semiconductor optical amplification element 20 along the predetermined direction of axis 30. In this arrangement, the oscillation frequency $f_{LD}$ of the laser light satisfies:

$0 < f_{FG} - f_{LD} < 20$ GHz.

Flowchart 100 ends at step S105.

Figure 14B:
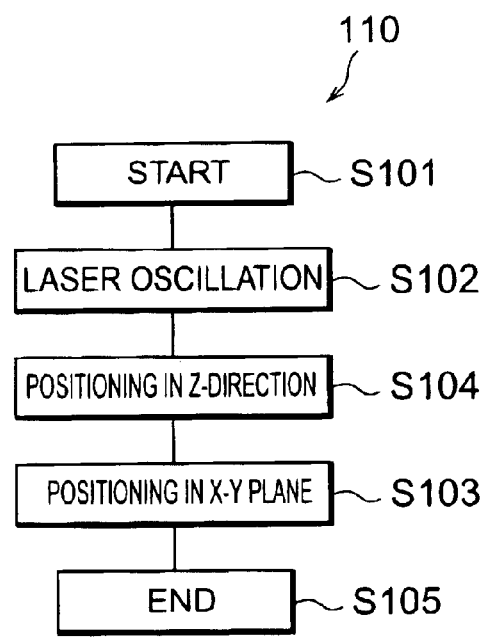
FIG. 14B is another flowchart showing the method of manufacturing an external cavity semiconductor laser.

FIG. 14B is flowchart 110 showing the method of manufacturing the external cavity semiconductor laser. In flowchart 110, the order of steps S103 and S104 in the flowchart 100 is reversed.

Figure 15A:
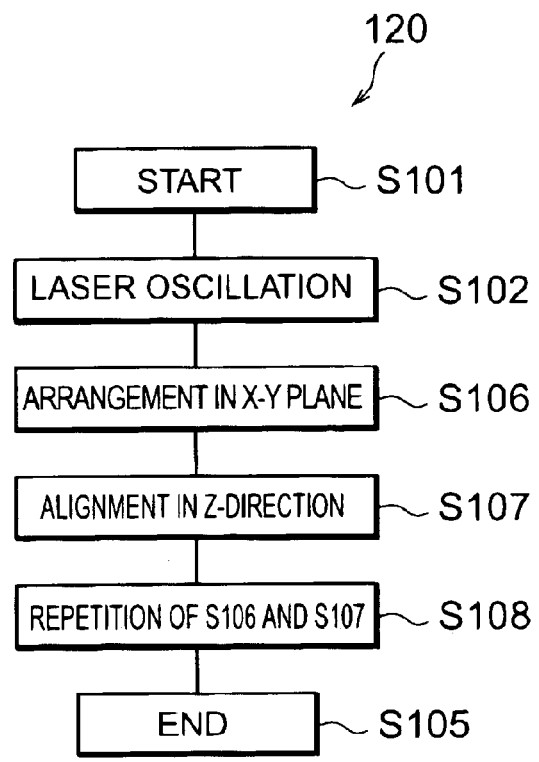
FIG. 15A is still another flowchart showing the method of manufacturing an external cavity semiconductor laser.

FIG. 15A is flowchart 120 showing the method of manufacturing the external cavity semiconductor laser. Referring to FIG. 15A, the flowchart for alignment starts with step S101. In step S102, grating fiber 16 and semiconductor optical amplification element 20 are preliminary arranged with each other. In step S106, grating fiber 16 and semiconductor optical amplification element 20 are aligned while relatively moving grating fiber 16 and semiconductor optical amplification element 20 along a plane (X-Y plane) intersecting the predetermined axis 30 such that light from the optical system exhibits the maximum value in the intensity of the light therefrom. In step S107, grating fiber 16 and semiconductor optical amplification element 20 are aligned with each other while measuring the wavelength or frequency of the laser light from the optical system and relatively moving grating fiber 16 and semiconductor optical amplification element 20 in a direction of the predetermined axis 30 such that the oscillation frequency $f_{LD}$ satisfies:

$0 < f_{FG} - f_{LD} < 20$ GHz.

In step S108, aligning grating fiber 16 and semiconductor optical amplification member 20 with each other are performed by repeating steps S106 and S107 by a desirable mumber. After this alignment, the intensity of the laser light exhibits the maximum value, and the oscillation frequency $f_{LD}$ satisfies:

$0 < f_{FG} - f_{LD} < 20$ GHz.

The flowchart 120 is ended at step S105.

Figure 15B:
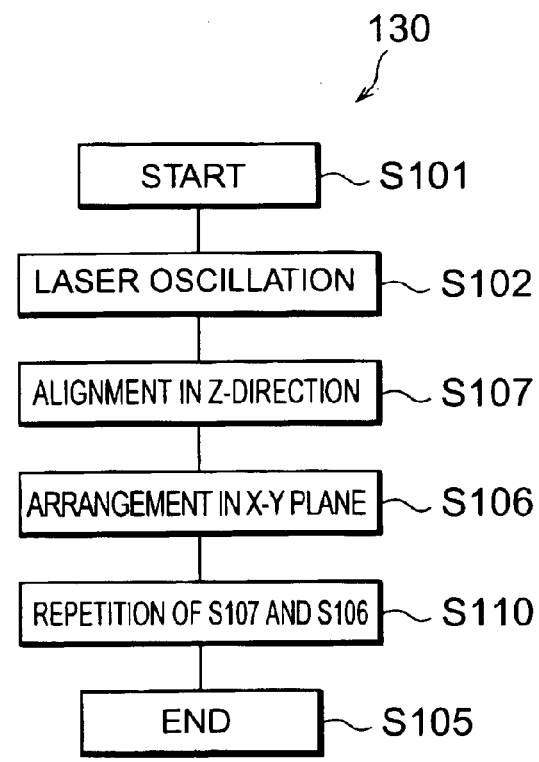
FIG. 15B is still another flowchart showing the method of manufacturing an external cavity semiconductor laser.

FIG. 15B is flowchart 130 showing the method of manufacturing the external cavity semiconductor laser. In flowchart 130, the order of steps S106 ad S107 in flowchart 120 is reversed. Accordingly, step S108 is changed to step S110.
(The Fourth Embodiment)

Figure 16:
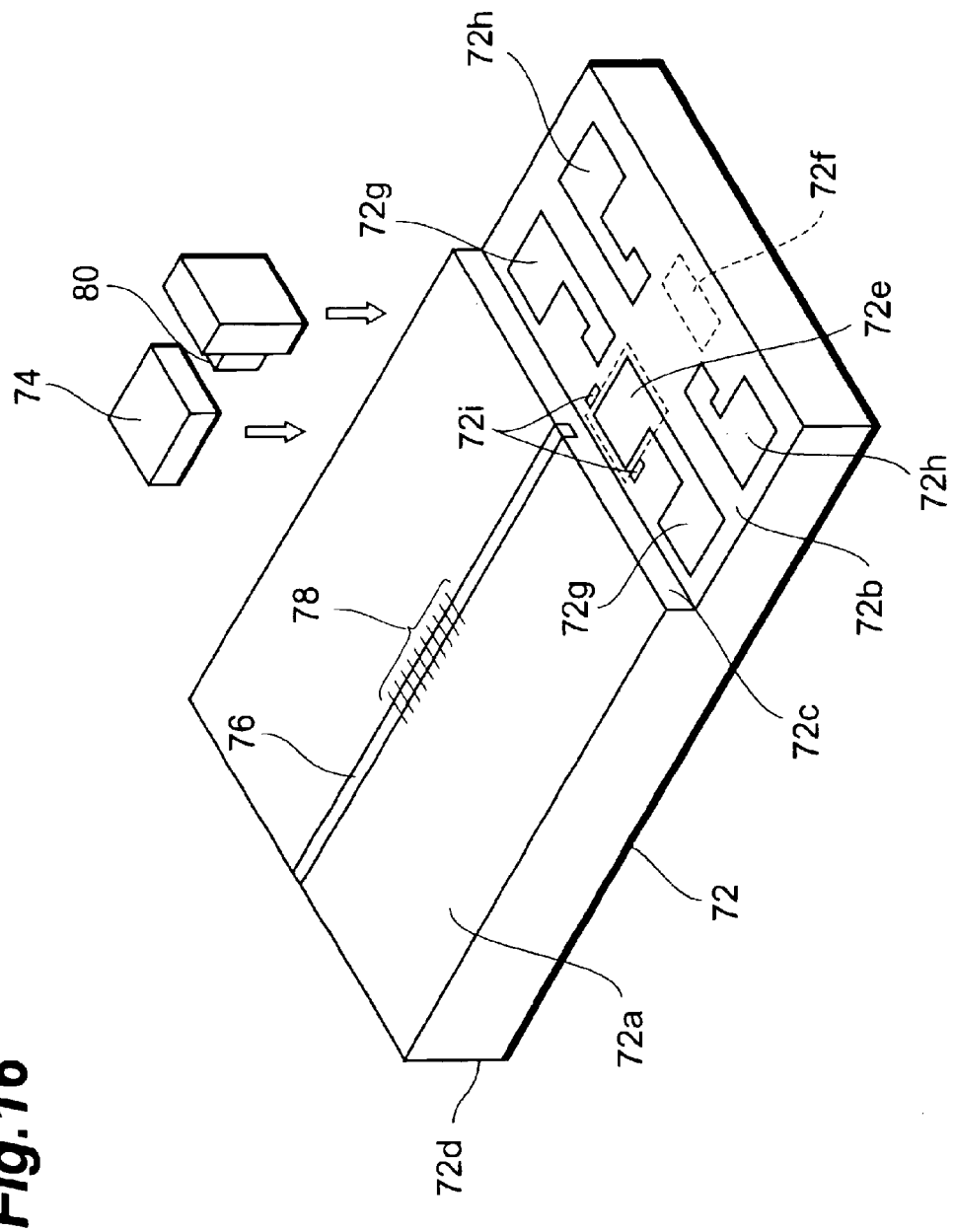
FIG. 16 is a view showing the components of an external cavity semiconductor laser according to another embodiment.
Figure 17:
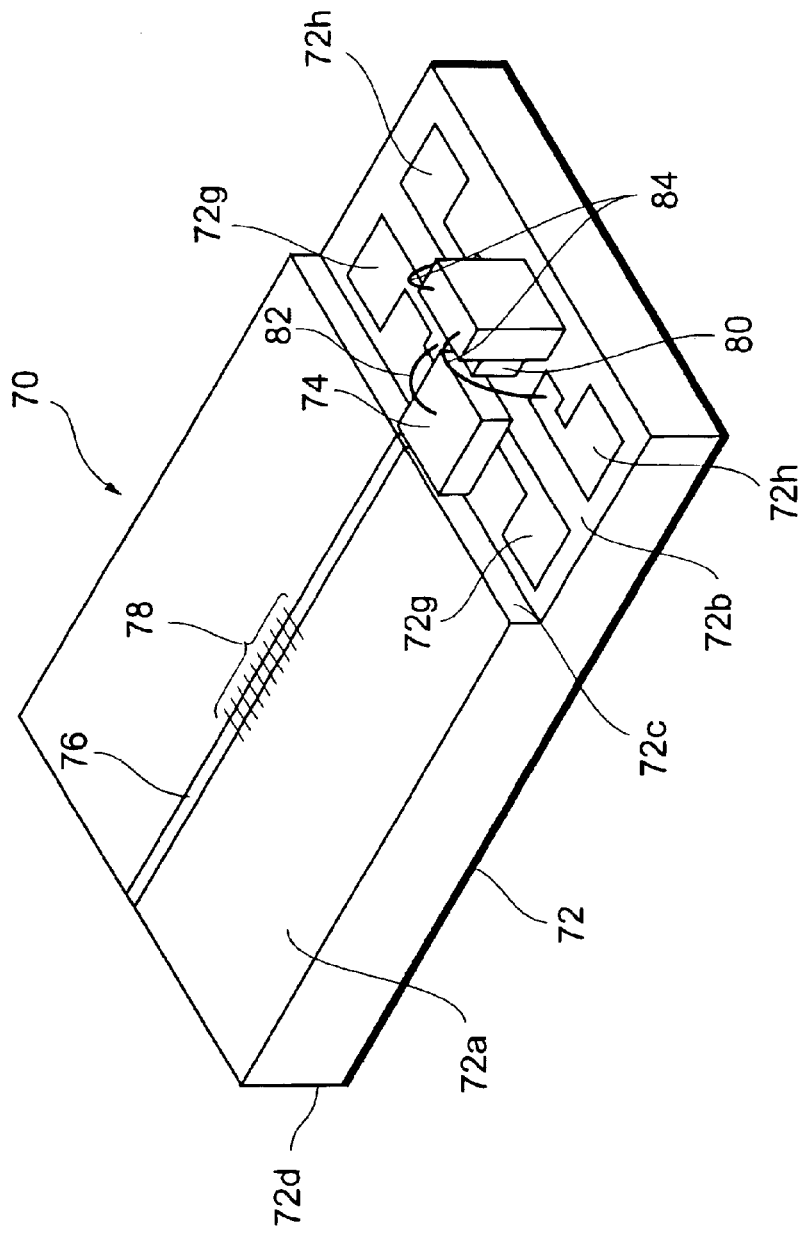
FIG. 17 is a view showing an external cavity semiconductor laser according to the embodiment.

FIG. 16 shows the components of an external cavity semiconductor laser according to still another embodiment. FIG. 17 shows the external cavity semiconductor laser according to this embodiment.

Main portion 70 of the external cavity semiconductor laser according to this embodiment comprises substrate 72, semiconductor optical amplification element 74, an optical waveguide device such as optical waveguide 76, and Bragg grating 78. The material of the substrate may be, for example, an III–V compound semiconductor, such as GaAs, InP, GaN or GaInAs, or a Si semiconductor. Main portion 70 may further comprise monitor semiconductor light-receiving element 80.

Substrate 72 has optical waveguide surface 72a and device surface 72b. End face 72c is provided at the boundary between optical waveguide surface 72a and device surface 72b. Device surface 72b has mounting region 72e for mounting semiconductor optical amplification element 74, mounting region 72f for mounting monitor semiconductor light-receiving element 80, electrodes 72g for semiconductor optical amplification element 74, and electrodes 72h for semiconductor light-receiving element 80. Optical waveguide 76 is provided on optical waveguide surface 72a of substrate 72. Bragg grating 78 is formed on optical waveguide surface 72a of substrate 72 so as to be optically coupled to optical waveguide 76.

Referring to FIG. 17, semiconductor optical amplification element 74 is provided on mounting region 72e of substrate 72 and thus optically coupled to optical waveguide 76 exposed to end face 72c. Semiconductor optical amplification element 74 exhibits the same characteristics as that of semiconductor optical amplification element 20 in the first embodiment, but is not particularly limited thereto. Semiconductor optical amplification element 74 on mounting region 72e is electrically connected to electrodes 72g via wires 82 such as bonding wires. Semiconductor light-receiving element 80 is provided on mounting region 72f and thus optically coupled to semiconductor optical amplification element 74. Semiconductor light-receiving element 80 on mounting region 72f is electrically connected to electrodes 72h via wires 84, such as bonding wires.

Figure 18:
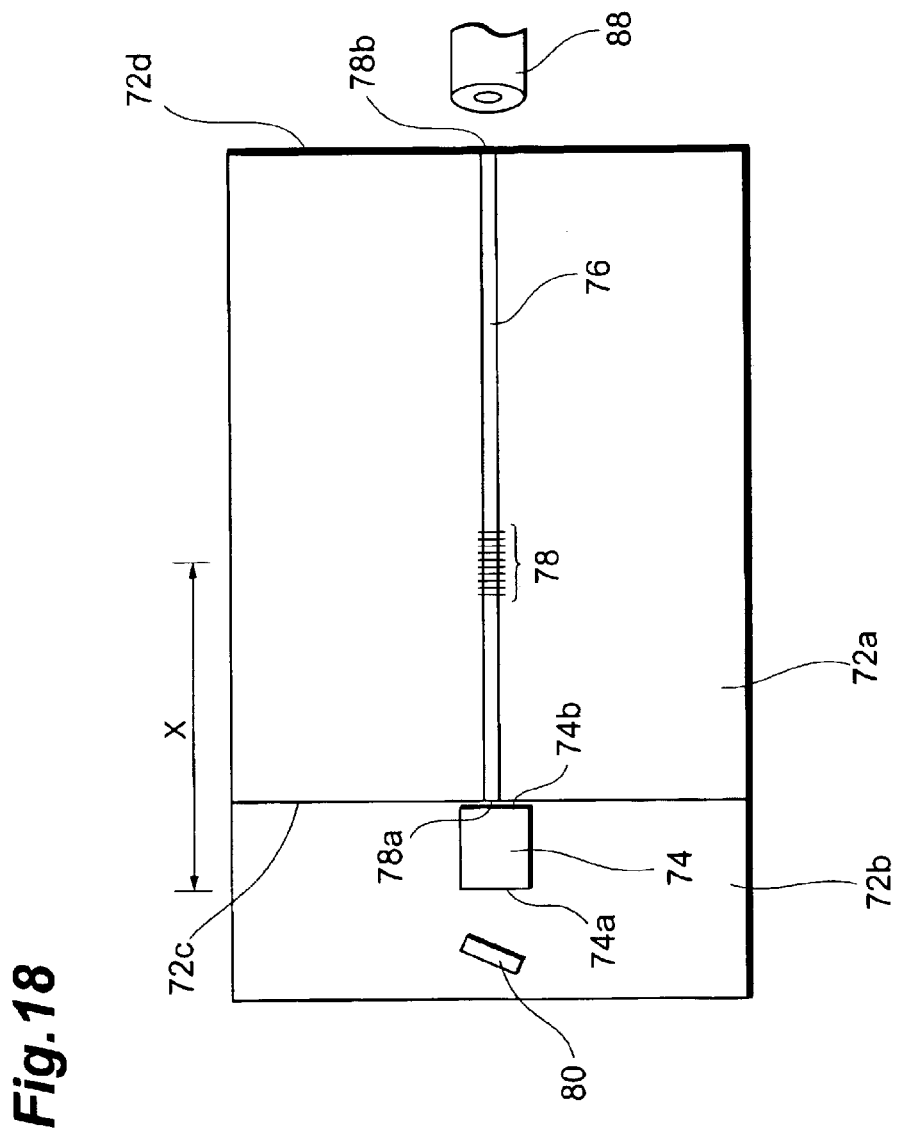
FIG. 18 is a plan view of the main portion of an external cavity semiconductor laser.

FIG. 18 is a plan view of main portion 70 of the external cavity semiconductor laser. Optical waveguide 76 extends from side face 72d to end face 72c of substrate 72. One end 76a of optical waveguide 76 is exposed to end face 72c, and the other end 76b of optical waveguide 76 is exposed to side surface 72d. Semiconductor optical amplification element 74 is optically coupled to one end 76a of optical waveguide 76. The other end 76b of optical waveguide 76 is optically coupled to external optical fiber 88. Output light from external cavity semiconductor laser 70 is provided through external optical fiber 88. The optical cavity is formed of Bragg grating 78 and light-reflecting surface 74a of semiconductor optical amplification element 74. Light-reflecting surface 74a faces semiconductor light-receiving element 80. Light-emitting surface 74b is optically coupled to one end of optical waveguide 76.

In this main portion 70, the arrangement of semiconductor optical amplification element 74 and optical waveguide 76 is determined such that the oscillation frequency $f_{LD}$ satisfies:

$$0 < f_{FG} - f_{LD} < 20 \text{ GHz.} \quad (4)$$

After this arrangement, an optical cavity length X is determined. The above description has been provided in terms of the semiconductor substrate. However, the substrate is not limited to a semiconductor substrate, and a substrate containing $LiNbO_3$ or $LiTaO_3$ can also be used.

This embodiment has exemplified an external cavity semiconductor laser including a semiconductor optical amplification element provided on a semiconductor substrate. However, when a III–V compound semiconductor is provided on the substrate, the semiconductor optical amplification element and optical waveguide may be integrated on the substrate.

Figure 19:
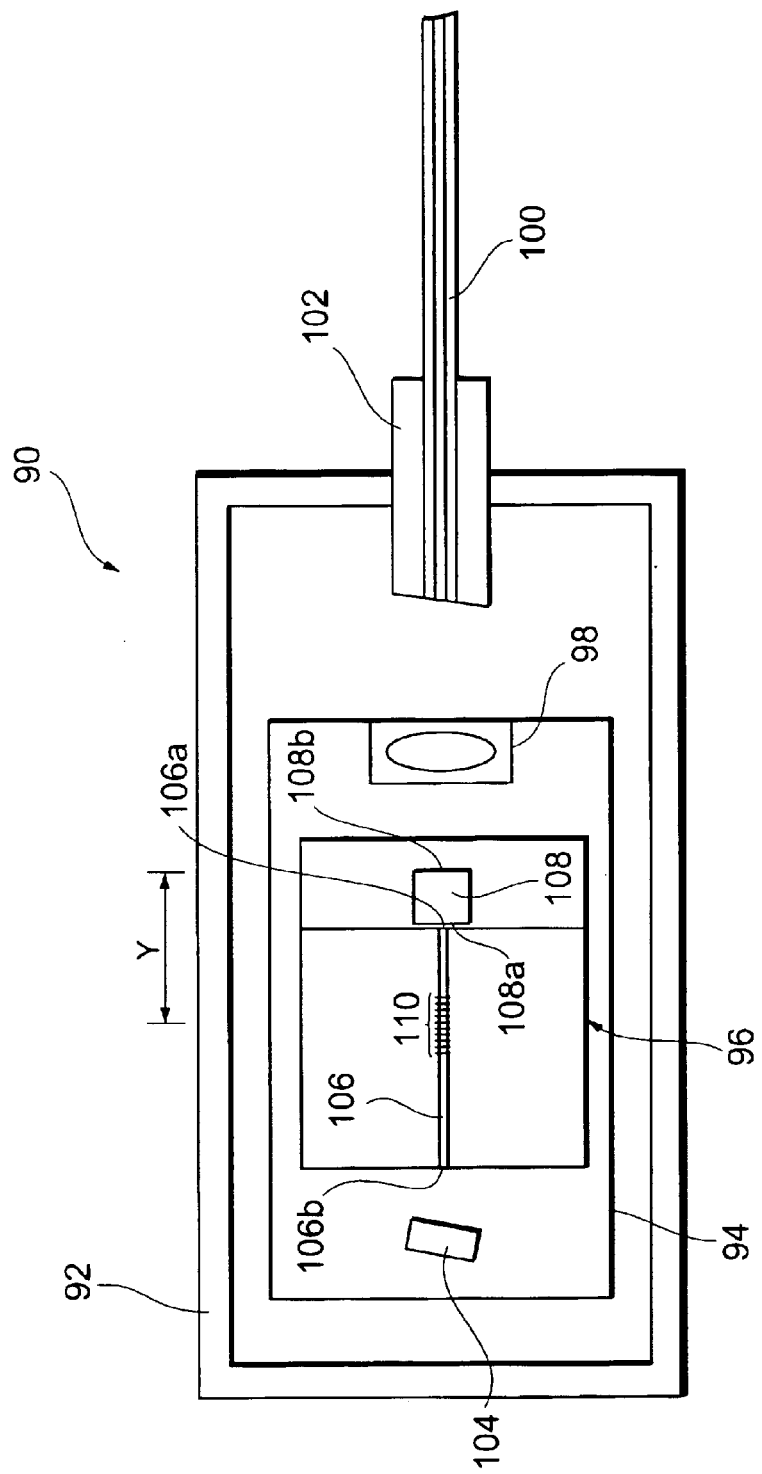
FIG. 19 is a plan view showing still another external cavity semiconductor laser.

FIG. 19 is a plan view showing another external cavity semiconductor laser. External cavity semiconductor laser 90 includes a main portion similar to that of the external cavity semiconductor laser shown in FIG. 18. External cavity semiconductor laser 90 comprises housing 92, support member 94, main portion 96, lens portion 98, optical fiber 100, ferrule 102 and semiconductor light-receiving element 104. Support member 94 is provided on the bottom surface of housing 92. Main portion 96, lens portion 98 and semiconductor light-receiving element 104 are arranged on support table 94. Optical fiber 100 is held by ferrule 102. Main portion 96 includes an optical waveguide device, such as optical waveguide 106, and semiconductor optical amplification element 108. Optical waveguide 106 has a pair of end portions 106a and 106b. Diffraction grating 110 is optically coupled to optical waveguide 106. One end face 108a of semiconductor optical amplification element 108 is optically coupled to one end 106a of optical waveguide 106. The other end face 108b is optically coupled to optical fiber 100 through lens portion 98. Output light from external cavity semiconductor laser 90 is provided through optical fiber 100. In this main portion 96 as well, the arrangement of semiconductor optical amplification element 108 and diffraction grating 110 is determined such that the expression (4) is satisfied. The optical cavity length is indicated by Arrow Y.

(The Fifth Embodiment)

Figure 20:
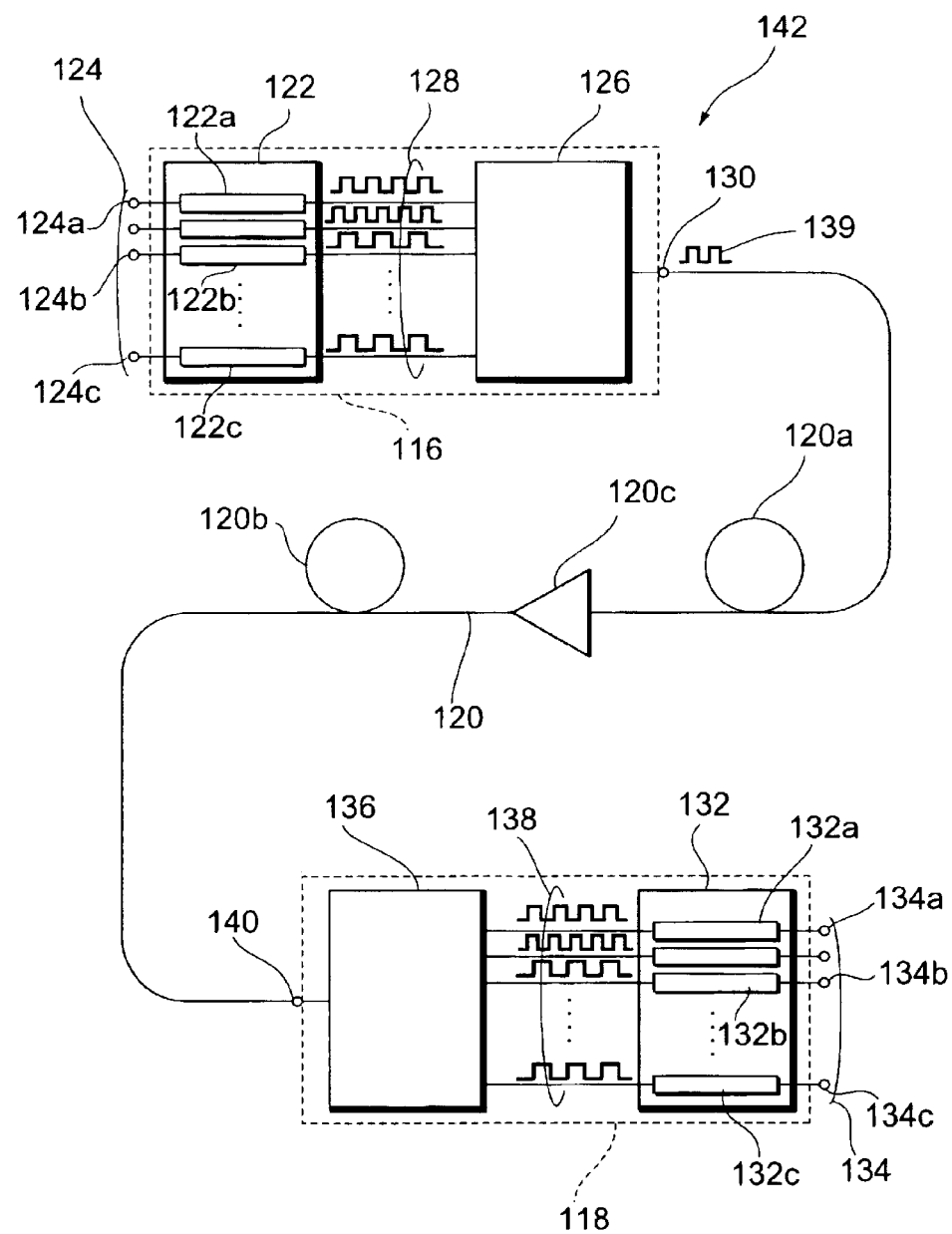
FIG. 20 is a view showing a wavelength multiplex communication system according to still another embodiment.

FIG. 20 shows a wavelength multiplex communications system according to still another embodiment. Wavelength multiplex communications system 142 comprises optical signal transmitting device 116, optical signal receiving device 118, and transmission line 120. Transmission line 120 couples optical signal transmitting device 116 and optical signal receiving device 118 with each other to transmit an optical signal from optical signal transmitting device 116 to optical signal receiving device 118.

Optical signal transmitting device 116 comprises input 124, optical signal generator 122, optical multiplexer 126, and output 130. Optical signal generator 122 includes one or more external cavity semiconductor lasers 122a, 122b and 122c. External cavity semiconductor lasers 122a, 122b and 122c receive electrical signals from corresponding inputs 124a, 124b and 124c, and generate optical signals, respectively. Optical multiplexer 126 multiplexes the generated optical signals 128 and supplies a wavelength multiplex optical signal to output 139.

In external cavity semiconductor lasers 122a, 122b and 122c of optical signal transmitting apparatus 116, the oscillation wavelengths of the respective external cavity semiconductor lasers are different from each other. Each of external cavity semiconductor lasers 122a, 122b and 122c includes a Bragg grating. The spacing of diffraction wavelengths of the Bragg grating is preferably 1.6 nanometers to 25.6 nanometers.

The external cavity semiconductor lasers 122a, 122b and 122c are connected to a driving circuit. This driving circuit drives external cavity semiconductor lasers 122a, 122b and 122c by modulation signals having modulation periods $T_1$, $T_2$ and $T_3$, respectively.

Optical signal receiving device 118 includes optical receiver 132 and optical demultiplexer 136. Optical demultiplexer 136 receives the wavelength multiplex optical signal from transmission line 120 at input 140. The received wavelength multiplex optical signal is demultiplexed to form demultiplex optical signals, and the demultiplex optical signals 138 are supplied to units 132a, 132b and 132c of optical receiver 132, respectively. The units convert the optical signals into electrical signals using photoelectric conversion elements and then supply the converted electrical signals to outputs 134a to 134c, respectively. Transmission line 120 transmits the wavelength multiplex optical signal from optical signal transmitting device 116 to optical signal receiving device 118 via optical fibers 120a and 120b and optical amplifier 120c.

Having been illustrated and described the principles of the present invention in the preferred embodiments, those skilled in the art can recognize that various modifications in arrangement and details can be made without departing from the principles of the present invention. For example, the optical waveguide can be made from any one of a silica optical fiber, a silica flat optical waveguide, a polymer optical fiber, and a polymer flat optical waveguide. In the method of manufacturing the external cavity semiconductor laser, either the wavelength or frequency of the laser light may be monitored in determining the arrangement. We, therefore, claims all such variations and modifications from the spirit and the scope of the invention.

What is claimed is:

1. A method of manufacturing an external cavity semiconductor laser, the method comprising the steps of
mounting a semiconductor optical amplification element on a mount;
along a direction of a predetermined axis, arranging an optical waveguide device having an optical waveguide and a Bragg grating with a maximum reflectivity at a frequency $f_{FG}$;
arranging said optical waveguide device and said semiconductor optical amplification element along said axis while monitoring an oscillation frequency $f_{LD}$ and intensity of light from an optical system composed of said semiconductor optical amplification element and said optical waveguide device; and
securing said optical waveguide device with respect to said mount.

2. The method according to claim 1,
wherein arranging said optical waveguide device and said semiconductor optical amplification element comprises a step of adjusting a distance between said optical waveguide device and said semiconductor optical amplification element such that an oscillation frequency $f_{LD}$ of said light satisfies:

$$0 < f_{FG} - f_{LD} < 20 \text{ GHz},$$

said distance being taken in a direction of said predetermined axis.

3. The method according to claim 1, wherein arranging said optical waveguide device and said semiconductor optical amplification element comprises the steps of:
arranging said optical waveguide device and said semiconductor optical amplification element while relatively moving said optical waveguide device and said semiconductor optical amplification element along a plane intersecting said predetermined axis such that said optical system exhibits a maximum value in an intensity of light therefrom; and
arranging said optical waveguide device and said semiconductor optical amplification element by measuring one of the wavelength and frequency of laser light therefrom while relatively moving said optical waveguide device and said semiconductor optical amplification element in a direction of said predetermined axis such that an oscillation frequency $f_{LD}$ of said laser light satisfies:

$$0 < f_{FG} - f_{LD} < 20 \text{ GHz}.$$

4. The method according to claim 1, wherein arranging said optical waveguide device and said semiconductor optical amplification element comprises the steps of comprises the steps of:
(a) arranging said optical waveguide device and said semiconductor optical amplification element while relatively moving said optical waveguide device and said semiconductor optical amplification element along a plane intersecting said predetermined axis such that said optical system exhibits a maximum value in an intensity of laser light therefrom;
(b) arranging said optical waveguide device and said semiconductor optical amplification element by measuring one of a wavelength and frequency of laser light from said optical system while relatively moving said optical waveguide device and said semiconductor optical amplification element in a direction of said predetermined axis such that an oscillation frequency $f_{LD}$ of said laser light satisfies $$0 < f_{FG} - f_{LD} < 20 \text{ GHz; and}$$

(c) repeating said step (a) and said step (b) to arrange said optical waveguide device and said semiconductor optical amplification element, wherein an intensity of said laser light in said arrangement exhibits a maximum value and an oscillation frequency $f_{LD}$ of said laser light in said arrangement satisfies $$0 < f_{FG} - f_{LD} < 20 \text{ GHz}.$$

5. The method according to claim 1, wherein arranging said optical waveguide device and said semiconductor optical amplification element comprises the steps of:
determining a first arrangement of said optical waveguide device and said semiconductor optical amplification element by measuring one of a wavelength and frequency of laser light from the optical system and an intensity thereof while relatively moving said optical waveguide device and said semiconductor optical amplification element along the direction of said predetermined axis and a plane intersecting said predetermined axis, an intensity of said laser light in the first arrangement exhibiting a maximum value, and the oscillation frequency $f_{LD}$ of said laser light in the first arrangement satisfying $0 < f_{FG} < f_{LD} < 20$ GHz;
after determining said first arrangement, positioning said optical waveguide device and said semiconductor optical amplification element with respect to a direction of said predetermined axis;
after positioning said optical waveguide device and said semiconductor optical amplification element, determining a second arrangement of said optical waveguide device and said semiconductor amplification element while relatively moving said optical waveguide device and said semiconductor optical amplification element along a plane intersecting said predetermined axis, said optical system in said second arrangement exhibiting a maximum value in an intensity of laser light therefrom; and
after determining said second arrangement, positioning said optical waveguide device and said semiconductor optical amplification element with respect to said plane intersecting said predetermined axis.

6. The method according to claim 1, wherein said optical waveguide device includes a grating fiber.

7. The method according to claim 1, wherein said step of determining the arrangement comprises the steps of:
determining a first arrangement of said optical waveguide device and said semiconductor optical amplification element by measuring one of wavelength and frequency of laser light from said optical system and an intensity thereof while relatively moving said optical waveguide device and said semiconductor optical amplification element in a direction of said predetermined axis and along a plane intersecting said predetermined axis, an intensity of said laser light in said first arrangement exhibiting a maximum value, and an oscillation frequency $f_{LD}$ of said laser light satisfying $$0 < f_{FG} - f_{LD} < 20 \text{ GHz}$$

in said first arrangement; and after determining said first arrangement, positioning said optical waveguide device and said semiconductor optical amplification element at their first positions with respect to said direction of said predetermined axis and at their second position with respect to a plane intersecting said predetermined axis.

8. A method of manufacturing an external cavity semiconductor laser comprising the steps of:

mounting a semiconductor optical amplification element on a mount;

in a direction of a predetermined axis, arranging an optical wave guide device having an optical waveguide and a Bragg grating with a maximum reflectivity at a wavelength $\lambda_{FG}$;

arranging said optical waveguide device and said semiconductor optical amplification element along said axis while monitoring an oscillation wavelength frequency $\lambda_{LD}$ and an intensity of light from an optical system composed of said semiconductor optical amplification element and said optical waveguide device; and securing said optical waveguide device with respect to said mount.

9. The method according to claim 8, wherein arranging said optical waveguide device and said semiconductor optical amplification element comprises the step of adjusting a distance along said predetermined axis between said optical waveguide device and said semiconductor optical amplification element such that an oscillation wavelength $\lambda_{LD}$ thereof satisfies:

$0<\lambda_{LD}-\lambda_{FG}<0.16$ nm.

10. A method of manufacturing an external cavity semiconductor laser comprising a grating fiber and a semiconductor optical amplification element, said method comprising the steps of:

mounting a semiconductor optical amplification element on a stem;

providing a grating fiber having a maximum reflectivity at a wavelength $\lambda_{FG}$;

arranging said semiconductor optical amplification element and said grating fiber while energizing said semiconductor optical amplification element through said stem and monitoring a wavelength $\lambda_{LD}$ and intensity of light from an optical system including said semiconductor optical amplification element and said grating fiber; and securing said grating fiber with respect to said stem.

11. The method according to claim 10, wherein said arrangement is determined such that said wavelength $\lambda_{LD}$ satisfies:

$0<\lambda_{LD}-\lambda_{FG}<0.16$ nm.

12. A method of manufacturing an external cavity semiconductor laser comprising a grating fiber and a semiconductor optical amplification element, said method comprising the steps of:

mounting a semiconductor optical amplification element on a stem;

providing a grating fiber having a maximum reflectivity at a frequency $f_{FG}$ in a direction of a predetermined axis;

arranging said semiconductor optical amplification element and said grating fiber along said axis while energizing said semiconductor optical amplification element through said stem to monitor a frequency $f_{LD}$ and intensity of light from an optical system including said semiconductor optical amplification element and said grating fiber; and securing said grating fiber with respect to said stem.

13. The method according to claim 12, wherein said arrangement is determined such that an oscillation frequency $f_{LD}$ satisfies:

$0<f_{FG}-f_{LD}<20$ GHz.

14. The method according to claim 12, wherein said stem mounts thereon a first member having a side wall portion extending in a direction of said predetermined axis;

wherein said grating fiber is provided in a second member having a side wall portion extending in a direction of said predetermined axis; and wherein determining an arrangement comprises the steps of:

determining a first arrangement of said grating fiber and said semiconductor optical amplification element by relatively moving one member of said first member and said second member with respect to the other member along a plane intersecting said predetermined axis, said optical system exhibiting a maximum value in an intensity of laser light therefrom in said first arrangement;

after determining said first arrangement, securing said first member and said second member to one another;

determining a second arrangement of said optical waveguide device and said semiconductor optical amplification element by relatively moving one of said grating fiber and said semiconductor optical amplification element with respect to the other one in a direction of said predetermined axis, an oscillation frequency $f_{LD}$ of laser light from said optical system satisfying $0<f_{FG}-f_{LD}<20$ GHz; and after determining said second arrangement, positioning said grating fiber and said second member to one another.

15. The method according to claim 12, wherein said stem mounts thereon a first member having a side wall portion extending in the direction of said predetermined axis;

wherein said grating fiber is provided in a second member having a side wall portion extending in said direction of said predetermined axis; and wherein determining an arrangement comprises the steps of:

determining an arrangement of said optical waveguide device and said semiconductor optical amplification element by relatively moving one member of said first member and said second member with respect to the other one in a direction of said predetermined axis and along a plane intersecting said predetermined axis and by relatively moving one of said grating fiber and said semiconductor optical amplification element with respect to the other one in a direction of said predetermined axis, said optical system exhibiting a maximum value and oscillation frequency $f_{LD}$ of laser light from said optical system satisfies:

$0<f_{FG}-f_{LD}<20$ GHz;

after determining said arrangement, securing one member of said first member and said second member to the other member; and after determining said arrangement, securing one said grating fiber and said second member to the other one.

16. The method according to claim 12, wherein said stem mounts thereon a first member having a side wall portion extending in a direction of said predetermined axis;

wherein said grating fiber is provided in a second member having a side wall portion extending in a direction of said predetermined axis; and wherein determining an arrangement comprises the steps of:

determining a first arrangement of said grating fiber and said semiconductor optical amplification element by relatively moving one member of said first member and said second member with respect to the other one in a direction of said predetermined axis and along a plane intersecting said predetermined axis and by relatively moving one of said grating fiber and said semiconductor optical amplification element with respect to the other one in a direction of said predetermined axis, said optical system exhibiting a maximum value in an intensity of laser light therefrom, and an oscillation frequency of laser light from said optical system satisfying:

$$0 < f_{FG} - F_{LD} < 20 \text{ GHz};$$

after determining said first arrangement, securing one of said grating fiber and said second member to the other one;

determining a second arrangement of said grating fiber and said semiconductor optical amplification element by relatively moving one member of said first member and said second member with respect to the other member along a plane intersecting said predetermined axis, said optical system exhibiting a maximum value in an intensity of laser light therefrom; and after determining said second arrangement, securing one member of said first member and said second member to the other member.

17. A temperature-uncontrolled-type external cavity semiconductor laser comprising:

an optical waveguide device comprising a Bragg grating and an optical waveguide, said Bragg grating having a reflection spectrum with a maximum reflectivity at a frequency $f_{FG}$, and said Bragg grating being optically coupled to said optical waveguide; and a semiconductor optical amplification element optically coupled to said optical waveguide, said optical waveguide device and said semiconductor optical amplification element being arranged to provide a cavity for generating light, said cavity including said Bragg grating and said semiconductor optical amplification element, said light having an oscillation frequency $f_{LD}$ smaller than said $f_{FG}$, and a difference between said $f_{LD}$ and said $f_{FG}$ being smaller than 20 GHz.

18. The temperature uncontrolled-type external cavity semiconductor laser according to claim 17, further comprising:

a spacer member separating said grating fiber from said semiconductor optical amplification element; and a stem mounting said spacer member thereon, said semiconductor optical amplification element being provided on said stem.

19. An external cavity semiconductor laser comprising:

a semiconductor substrate;

a semiconductor optical amplification element provided on said semiconductor substrate;

an optical waveguide provided on said semiconductor substrate, said optical waveguide being optically coupled to said semiconductor optical amplification element; and a Bragg grating provided on said semiconductor substrate, said Bragg grating being optically coupled to said optical waveguide, said Bragg grating with a spectrum exhibiting a maximum reflectivity at a frequency $f_{FG}$, said semiconductor optical amplification element and said Bragg grating are arranged to provide a cavity for generating light, said cavity including said Bragg grating and said semiconductor optical amplification element, said light having an oscillation frequency $f_{LD}$ smaller than said $f_{FG}$, and a difference between said $f_{LD}$ and said $f_{FG}$ being smaller than 20 GHz.

20. The external cavity semiconductor laser according to claim 19, further comprising:

a spacer member separating said grating fiber from said semiconductor optical amplification element; and a stem mounting said spacer member thereon, said semiconductor optical amplification element being provided on said stem.

21. An external cavity semiconductor laser comprising:

a substrate containing at least one of $LiNbO_3$ and $LiTaO_3$;

an optical waveguide provided on said substrate;

a Bragg grating provided on said substrate, said Bragg grating being optically coupled to said optical waveguide, and said Bragg grating having a spectrum with a maximum reflectivity at a frequency $f_{FG}$; and a semiconductor optical amplification element optically coupled to said optical waveguide, said semiconductor optical amplification element and said Bragg grating are arranged to provide a cavity for generating light, said cavity including said Bragg grating and said semiconductor optical amplification element, said light having an oscillation frequency $f_{LD}$ smaller than said $f_{FG}$, and a difference between said $f_{LD}$ and said $f_{FG}$ being smaller than 20 GHz.

22. The external cavity semiconductor laser according to claim 21, further comprising:

a spacer member separating said grating fiber from said semiconductor optical amplification element; and a stem mounting said spacer member thereon, said semiconductor optical amplification element being provided on said stem.

23. An external cavity semiconductor laser, comprising:

an optical waveguide device having a Bragg grating and an optical waveguide, said Bragg grating having a reflection spectrum with a maximum reflectivity at a frequency $f_{FG}$, and said Bragg grating being optically coupled to said optical waveguide; and a semiconductor optical amplification element optically coupled to said optical waveguide, said semiconductor optical amplification elements and said Bragg grating are arranged to provide a cavity for generating light, said cavity including said Bragg grating and said semiconductor optical amplification element, said light having an oscillation frequency $f_{LD}$ smaller than said $f_{FG}$, and a difference between said $f_{LD}$ and said $f_{FG}$ being smaller than 20 GHz.

24. The external cavity semiconductor laser according to claim 23, further comprising an optical lens provided between said semiconductor optical amplification element and said optical waveguide device.

25. The external cavity semiconductor laser according to claim 23, wherein said Bragg grating has a full-width at half maximum of the reflection spectrum smaller than 75 GHz.

26. The external cavity semiconductor laser according to claim 23, wherein said Bragg grating has a full-width at half maximum of the reflection spectrum larger than a frequency spacing of longitudinal modes of said external cavity semiconductor laser.

27. The external cavity semiconductor laser according to claim 23, wherein said Bragg grating has a maximum reflectivity greater than 10%.

28. The external cavity semiconductor laser according to claim 23, wherein said Bragg grating has a reflection spectrum in which a reflectivity of a side lobe is 10% or less of said maximum reflectivity thereof.

29. The external cavity semiconductor laser according to claim 23, wherein an absolute value of a difference between a wavelength $\lambda_P$ and a wavelength $\lambda_{FG}$ is 30 nm or smaller, said semiconductor optical amplification element exhibits a gain peak at said wavelength $\lambda_P$ and said Bragg grating exhibits a reflection peak at said wavelength $\lambda_{FG}$.

30. The external cavity semiconductor laser according to claim 23, wherein said optical waveguide device comprises one of a silica optical fiber, a silica optical planar waveguide, a polymer optical fiber and a polymer optical planar waveguide.

31. The external cavity semiconductor laser according to claim 23,
wherein said semiconductor optical amplification element has a pair of end faces;
wherein said optical waveguide is optically coupled to one face of said pair of end faces of said semiconductor optical amplification element; and
wherein a light reflectivity of said one face is 0.4% or lower.

32. The external cavity semiconductor laser according to claim 23, further comprising:
a spacer member separating said grating fiber from said semiconductor optical amplification element; and
a stem mounting said spacer member thereon, said semiconductor optical amplification element being provided on said stem.

33. An external cavity semiconductor laser comprising:
a semiconductor optical amplification element;
a stem mounting said semiconductor optical amplification element thereon;
a grating fiber having a Bragg grating with a reflection spectrum exhibiting a maximum reflectivity at a frequency $f_{FG}$; and
a spacer member provided on said stem, said spacer member separating said grating fiber from said semiconductor optical amplification element to provide a cavity for generating light, said cavity including said Bragg grating and said semiconductor optical amplification element, said light having an oscillation frequency $f_{LD}$ smaller than said $f_{FG}$, and a difference between said $f_{LD}$ and said $f_{FG}$ being smaller than 20 GHz.

34. The external cavity semiconductor laser according to claim 33, wherein said semiconductor optical amplification element has an active layer capable of generating light having a wavelength in a wavelength range of 1.25 micrometer to 1.65 micrometer.

35. The external cavity semiconductor laser according to claim 33,
wherein said spacer member includes a first member having a side wall portion extending in a direction of a predetermined axis, and a second member having a side wall portion extending in a direction of said predetermined axis;
wherein said stem supports said first member;
wherein said first member supports said second member; and
wherein said grating fiber is provided in said second member.

36. The external cavity semiconductor laser according to claim 35, further comprising a flange receiving said grating fiber therein,
wherein said flange is secured to said second member; and
wherein said second member is secured to one end of said first member.

37. The external cavity semiconductor laser according to claim 35, further comprising:
a flange receiving said grating fiber therein;
a first welded portion, said flange and the side wall portion of said second member being welded by said first welded portion; and
a second welded portion, an end portion of said side wall portion of said second member and an end portion of said side wall portion of said first member being welded by second welded portion.

38. The external cavity semiconductor laser according to claim 33,
wherein said stem has a pair of faces along a plane extending in a direction intersecting a predetermined axis;
wherein said stem has a hole extending from one face to the other face of said pair of faces; and
wherein said stem has a lead terminal passing through said hole.

39. The external cavity semiconductor laser according to claim 33, further comprising:
a lens provided between said grating fiber and said semiconductor optical amplification element; and
a cover member mounted on said stem and supporting said lens.

40. The external cavity semiconductor laser according to claim 39, wherein said cover member is provided in said spacer member.

41. The external cavity semiconductor laser according to claim 33, further comprising:
a hermetic glass provided between said grating fiber and said semiconductor optical amplification element; and
a cover member mounted on said stem and supporting said hermetic glass;
wherein said grating fiber has an leased end portion.

42. The wavelength multiplex transmission system comprising:
a first external cavity semiconductor laser according to claim 23;
a second external cavity semiconductor laser according to claim 23; and
an optical transmission line having an end optically coupled to said first and second external cavity semiconductor lasers;
wherein an oscillation frequency $f_{LD1}$ in said first external cavity semiconductor laser is different from an oscillation frequency $f_{LD2}$ in said second external cavity semiconductor laser.

43. A wavelength multiplex transmission system comprising:
   a first external cavity semiconductor laser according to claim 33;
   a second external cavity semiconductor laser according to claim 33; and
   an optical transmission line having an end optically coupled to said first and second external cavity semiconductor lasers;
wherein an oscillation frequency $f_{LD1}$ in said first external cavity semiconductor laser is different from an oscillation frequency $f_{LD2}$ in said second external cavity semiconductor laser.

44. The wavelength multiplex transmission system according to claim 43, wherein intervals of diffraction wavelengths of said gratings in said first and second external cavity semiconductor lasers are not less than 1.6 nm and not greater than 25.6 nm.

* * * * *